(12) United States Patent
Park

(10) Patent No.: US 8,624,270 B2
(45) Date of Patent: Jan. 7, 2014

(54) DEVICE HAVING A PLURALITY OF LIGHT EMITTING STRUCTURES BONDED BY ADHESIVE LAYERS AND LIGHT EMITTING DEVICE PACKAGE HAVING THE SAME

(75) Inventor: Kyung Wook Park, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 582 days.

(21) Appl. No.: 12/906,856

(22) Filed: Oct. 18, 2010

(65) Prior Publication Data

US 2011/0089440 A1    Apr. 21, 2011

(30) Foreign Application Priority Data

Oct. 19, 2009  (KR) .................. 10-2009-0099286

(51) Int. Cl.
*H01L 29/18*   (2006.01)
*H01L 27/15*   (2006.01)
*H01L 33/00*   (2010.01)
*H01L 21/00*   (2006.01)

(52) U.S. Cl.
USPC .......... 257/88; 257/96; 257/79; 257/E33.067; 438/28

(58) Field of Classification Search
None
See application file for complete search history.

(56) References Cited

U.S. PATENT DOCUMENTS

| | | | |
|---|---|---|---|
| 6,448,102 B1 | 9/2002 | Kneissl et al. | |
| 6,465,961 B1 | 10/2002 | Cao | |
| 7,800,126 B2 * | 9/2010 | Yamamoto | 257/103 |
| 2006/0256826 A1 | 11/2006 | Lin et al. | |
| 2007/0257269 A1 | 11/2007 | Cho et al. | |
| 2008/0251799 A1 * | 10/2008 | Ikezawa | 257/89 |
| 2009/0072257 A1 | 3/2009 | Unno et al. | |
| 2009/0109151 A1 * | 4/2009 | Kim et al. | 345/83 |
| 2010/0032691 A1 * | 2/2010 | Kim | 257/88 |
| 2010/0264843 A1 | 10/2010 | Herrmann | |
| 2010/0289046 A1 * | 11/2010 | Idei | 257/98 |

FOREIGN PATENT DOCUMENTS

| | | |
|---|---|---|
| DE | 10 2008 013030 A1 | 6/2009 |
| EP | 2228838 A1 * | 9/2010 |
| JP | 2003-152222 A | 5/2003 |
| JP | 2003-197968 A | 7/2003 |
| JP | 2006-332688 A | 12/2006 |
| KR | 10-2003-0066955 A | 8/2003 |
| KR | 10-2005-0060739 A | 6/2005 |
| KR | 10-2006-117210 | 11/2006 |
| KR | 10-0736623 B | 7/2007 |
| KR | 10-2008-0001287 A | 1/2008 |
| WO | WO 2006043796 A1 * | 4/2006 |

* cited by examiner

*Primary Examiner* — Julio J Maldonado
*Assistant Examiner* — Harpreet Singh
(74) *Attorney, Agent, or Firm* — McKenna Long & Aldridge LLP

(57) ABSTRACT

Disclosed are a light emitting device and a light emitting device package having the same. The light emitting device includes a first chip structure including a first reflective layer and a first light emitting structure having a plurality of compound semiconductor layers on the first reflective layer; a second chip structure bonded onto the first chip structure and including a second reflective layer and a second light emitting structure having a plurality of compound semiconductor layers on the second reflective layer; and an electrode on the second chip structure.

20 Claims, 22 Drawing Sheets

DEVICE HAVING A PLURALITY OF LIGHT EMITTING STRUCTURES BONDED BY ADHESIVE LAYERS AND LIGHT EMITTING DEVICE PACKAGE HAVING THE SAME

The present application claims priority under 35 U.S.C. §119(a) of Korean Patent Application No. 10-2009-0099286 filed on Oct. 19, 2009, which is hereby incorporated by reference in its entirety.

BACKGROUND OF THE INVENTION

The embodiment relates to a light emitting device and a light emitting device package having the same.

Groups III-V nitride semiconductors have been extensively used as main materials for light emitting devices, such as a light emitting diode (LED) or a laser diode (LD), due to the physical and chemical characteristics thereof. In general, the groups III-V nitride semiconductors include a semiconductor material having a compositional formula of $In_xAl_yGa_{1-x-y}N$ ($0 \leq x \leq 1$, $0 \leq y \leq 1$, and $0 \leq x+y \leq 1$).

The LED is a semiconductor device, which transmits/receives signals by converting an electric signal into infrared ray or light using the characteristics of compound semiconductors. The LED is used as a light source.

The LED or the LD using the nitride semiconductor material is mainly used for the light emitting device to provide the light. For instance, the LED or the LD is used as a light source for various products, such as a keypad light emitting part of a cellular phone, an electric signboard, and an illumination device.

SUMMARY OF THE INVENTION

The embodiment provides a light emitting device having a novel structure and a light emitting device package having such a light emitting device.

The embodiment provides a light emitting device having a plurality of chip structures bonded thereto and a light emitting device package having such a light emitting device.

The embodiment provides a light emitting device having a adhesive layer between a plurality of light emitting structures and a light emitting device package having such a light emitting device.

The embodiment provides a light emitting device, in which a second chip structure is bonded onto a first chip structure and a reflective layer is disposed in the first chip structure, and a light emitting device package having such a light emitting device.

The embodiment provides a light emitting device including a first chip structure that emits first light through a lateral side thereof and a second chip structure that emits second light through a top side and a lateral side thereof, and a light emitting device package having such a light emitting device.

An embodiment provides a light emitting device comprising, a first chip structure including a first reflective layer and a first light emitting structure having a plurality of compound semiconductor layers on the first reflective layer; a second chip structure bonded onto the first chip structure and including a second reflective layer and a second light emitting structure having a plurality of compound semiconductor layers on the second reflective layer; and an electrode on the second chip structure.

An embodiment provides a light emitting device comprising, a first chip structure emitting a first light and including a first reflective layer and a first light emitting structure having a plurality of compound semiconductor layers on the first reflective layer; and a second chip structure electrically bonded onto the first chip structure to emit a second light and including a second reflective layer and a second light emitting structure having a plurality of compound semiconductor layers on the second reflective layer, and an electrode connected electrically on the second light emitting structure.

An embodiment provides a light emitting device package comprising, a body; a plurality of lead electrodes on the body; a light emitting device bonded onto at least one lead electrode while being electrically connected to the lead electrodes; and a molding member surrounding the light emitting device, wherein the light emitting device includes a first chip structure including a first reflective layer and a first light emitting structure having a plurality of compound semiconductor layers on the first reflective layer; and a second chip structure bonded onto the first chip structure and including a second reflective layer and a second light emitting structure having a plurality of compound semiconductor layers on the second reflective layer.

DETAILED DESCRIPTION OF THE EMBODIMENTS

Figure 1:
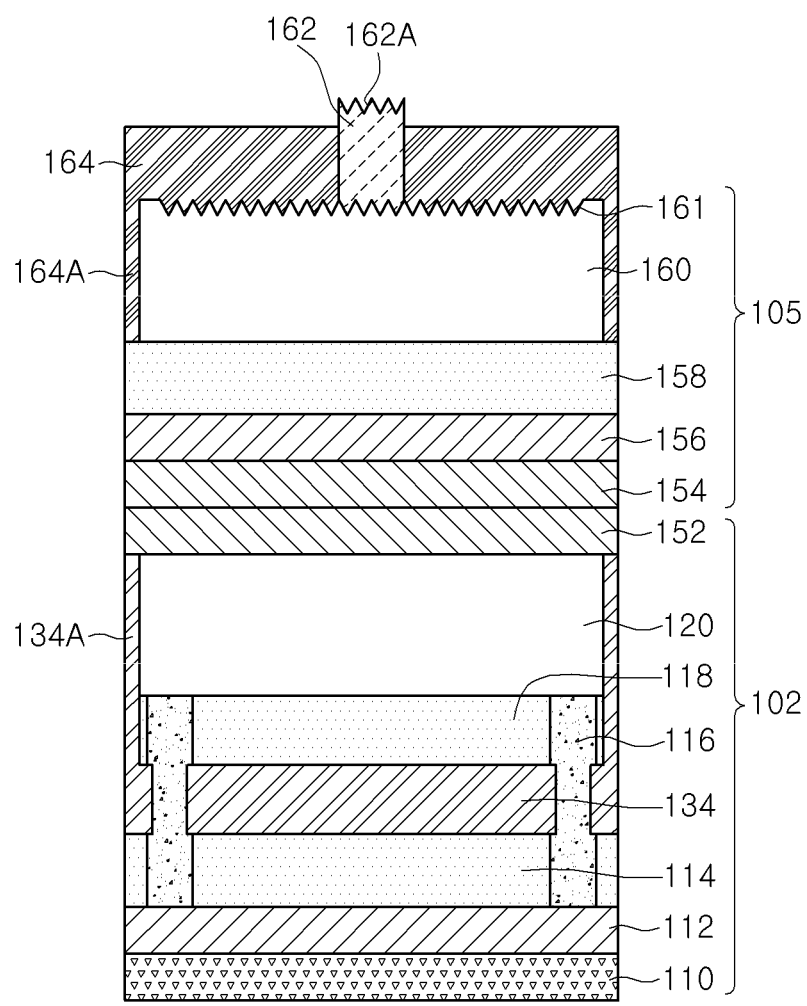
FIG. 1 is a side sectional view showing a light emitting device according to the first embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

Hereinafter, the embodiments will be described with reference to the accompanying drawings. The thickness and size of each layer shown in the drawings may be exaggerated, omitted or schematically drawn for the purpose of convenience or clarity. In addition, the size of elements does not utterly reflect an actual size.

FIG. 1 is a sectional view showing a light emitting device according to a first embodiment.

Referring to FIG. 1, the light emitting device 100 includes at least two chip structures 102 and 105. One or plural second chip structures 105 can be disposed on at least one first chip structure 102. In addition, one or plural second chip structures 105 can be disposed on plural first chip structures 102. The chip structures can be stacked in a two-layer structure or a three-layer structure and the chip structures may have the same width or different widths. The chip structures 102 and 105 of the light emitting device 100 may emit light having the same wavelength band or different wavelength bands. The following description will be made on the assumption that the first chip structure 102 is bonded perpendicularly to the second chip structure 105.

The light emitting device 100 includes the first chip structure 102 and the second chip structure 105 provided on the first chip structure 102.

The light emitting device 100 includes a conductive support member 110, a first reflective layer 112, a first transmittive electrode layer 114, a transmittive layer 134, a conductive layer 116, a second transmittive electrode layer 118, a first light emitting structure 120, a first adhesive layer 152, a second adhesive layer 154, a second reflective layer 156, a third transmittive electrode layer 158, a second light emitting structure 160, and an electrode 162.

The first chip structure 102 includes the conductive support member 110, the first reflective layer 112, the first transmittive electrode layer 114, the transmittive layer 134, the conductive layer 116, the second transmittive electrode layer 118, the first light emitting structure 120 and the first adhesive layer 152. The second chip structure 105 includes the second reflective layer 156, the third transmittive electrode layer 158, the second light emitting structure 160, the second adhesive layer 154 and the electrode 162.

The first chip structure 102 is electrically connected to the second chip structure 105 through the first and second adhesive layers 152 and 154. The first chip structure 102 is connected to the second chip structure 105 in series.

The conductive support member 110 of the first chip structure 102 is disposed at a base side of the light emitting device 100 and includes Cu, Au, Ni, Mo, Cu—W, or a carrier wafer, such as Si, Ge, GaAs, ZnO, SiC, SiGe, or GaN. The conductive support member 110 can be prepared in the form of a sheet through an electroplating process, but the embodiment is not limited thereto. The conductive support member 110 may serve as a path for supplying power.

The conductive support member 110 fully supports the light emitting device 100 and has a thickness of about 30~500 μm, but the embodiment is not limited thereto. The conductive support member 110 may be changed to an insulating support member such as an $Al_2O_3$ material.

The first reflective layer 112 is formed on the conductive support member 110. The first reflective layer 112 may include one selected from the group consisting of Ag, Ni, Al, Rh, Pd, Ir, Ru, Mg, Zn, Pt, Au, Hf and combination thereof. That is, the reflective layer 112 may include at least one metal layer, but the embodiment is not limited thereto. The first reflective layer 112 reflects the light emitted from the first light emitting structure 120, thereby increasing quantity of light. The first reflective layer 112 may include reflective material having reflectivity of about 50% or above.

The first transmittive electrode layer 114 is formed on the first reflective layer 112. The first transmittive electrode layer 114 can be prepared in the form of a pattern or a layer to allow the light, which is incident into or reflected from the first reflective layer 112, to pass through the first transmittive electrode layer 114.

The first transmittive electrode layer 114 may include transmittive oxide series and/or nitride series. For instance, the first transmittive electrode layer 114 may include at least one selected from the group consisting of ITO (indium tin oxide), IZO (indium zinc oxide), IZON (IZO nitride), AZO (aluminum zinc oxide), IZTO (indium zinc tin oxide), IAZO (indium aluminum zinc oxide), IGZO (indium gallium zinc oxide), IGTO (indium gallium tin oxide), and ATO (antimony tin oxide).

The transmittive layer 134 is formed on the first transmittive electrode layer 114 and the second transmittive electrode 118 is formed on the transmittive layer 134. The transmittive layer 134 may include insulating material selected from the group consisting of $SiO_2$, $SiO_x$, $SiO_xN_y$, $Si_3N_4$, $Al_2O_3$, and $TiO_2$, but the embodiment is not limited thereto.

The transmittive layer 134 serves as a spacer. That is, the transmittive layer 134 provides a space such that the light emitted from the first light emitting structure 120 can be laterally guided. The transmittive layer 134 has a thickness greater than that of the second transmittive electrode layer 118. For instance, the thickness of the transmittive layer 134 is two times greater than that of the second transmittive electrode layer 118. In addition, at least one of the first and second transmittive electrode layers 114 and 118 may serve as the spacer.

The transmittive layer 134 has a refractive index different from that of adjacent layers. The refractive index of the insulating material is different from the refractive index of the material for the first and second transmittive electrode layers 114 and 118. Such difference in the refractive index may vary the critical angle of the light so that the light can be laterally extracted.

The second transmittive electrode layer 118 is formed on the transmittive layer 134. The second transmittive electrode layer 118 can be prepared in the form of a layer or a pattern. For instance, the second transmittive electrode layer 118 may include at least one selected from the group consisting of ITO (indium tin oxide), IZO (indium zinc oxide), IZON (IZO nitride), AZO (aluminum zinc oxide), IZTO (indium zinc tin oxide), IAZO (indium aluminum zinc oxide), IGZO (indium gallium zinc oxide), IGTO (indium gallium tin oxide), and ATO (antimony tin oxide), but the embodiment is not limited thereto.

The first and second transmittive electrode layers 114 and 118 may have multiple layer structures. For instance, the first and second transmittive electrode layers 114 and 118 may have the stack structure including a conductive oxide layer and a metal layer, such as Ag, Ni, Al, Rh, Pd, Ir, Ru, Mg, Zn, Pt, Au or Hf. The stack structure may include IZO/Ni, AZO/Ag, IZO/Ag/Ni, or AZO/Ag/Ni. The second transmittive electrode layer 118 comes into ohmic contact with the first light emitting structure 120, but the embodiment is not limited thereto.

At least one conductive layer 116 having a through hole structure or a via hole structure is formed in the first reflective layer 112, the first transmittive electrode layer 114, the transmittive layer 134, and the second transmittive electrode layer 118. The conductive layer 116 may include an ohmic layer, a metal layer, a seed layer or an adhesive layer. One or plural conductive layers 116 can be provided. The plural conductive layers 116 are spaced apart from each other to improve current efficiency.

The conductive layer 116 electrically connects the lower surface of the first light emitting structure 120 with the first reflective layer 112. The lower portion of the conductive layer 116 makes contact with the first transmittive electrode layer 114 and the first reflective layer 112 and the upper portion of the conductive layer 116 makes contact with the second transmittive electrode layer 118 and the lower surface of the first light emitting structure 120.

The conductive layer 116 at least one selected from the group consisting of ITO (indium tin oxide), IZO (indium zinc oxide), IZON (IZO nitride), AZO (aluminum zinc oxide), IZTO (indium zinc tin oxide), IAZO (indium aluminum zinc oxide), IGZO (indium gallium zinc oxide), IGTO (indium gallium tin oxide), ATO (antimony tin oxide), Ag, Ni, Al, Rh, Pd, Ir, Ru, Mg, Zn, Pt, Au, Hf and combination thereof, but the embodiment is not limited thereto.

The second transmittive electrode layer 118 is formed under the first light emitting structure 120 while making ohmic contact with the first light emitting structure 120 and the first reflective layer 112 is disposed under the second transmittive electrode layer 118. In this case, the transmittive layer 134, the conductive layer 116 and the first transmittive electrode layer 114 can be omitted and the second transmittive electrode layer 118 may serve as the spacer.

A part 134A of the transmittive layer 134 is positioned around an outer peripheral surface of the first light emitting structure 120. Thus, even if the transmittive layer 134 includes insulating material, the interlayer short can be prevented from occurring at the sidewall of the first light emitting structure 120.

The transmittive layer 134 can be formed by using the same material or different materials according to regions thereof. For instance, a region of the transmittive layer 134 formed between the first and second transmittive electrode layers 114 and 118 may include conductive material, such as ITO, or insulating material, and a region of the transmittive layer 134 formed at the outer peripheral surface of the first light emitting structure 120 may include insulating material.

The conductive layer 116 has a via-structure to electrically connect the first light emitting structure 120 to the first reflective layer 112. The conductive layer 116 is positioned between the first transmittive electrode layer 114 and the second transmittive electrode layer 118 to electrically connect the first light emitting structure 120 to the first reflective layer 112. Although the conductive layer 116 having the via structure is formed under the first chip structure 102, the conductive layer 116 can be formed along the lateral sides of the first transmittive electrode layer 114, the transmittive layer 134, and the second transmittive electrode layer 118, and the embodiment is not limited thereto.

The first light emitting structure 120 is formed on the second transmittive electrode layer 118 and the first adhesive layer 152 is formed on the first light emitting structure 120.

The first light emitting structure 120 includes a plurality of semiconductor layers including group III-V compound semiconductors and generates the light having the wavelength of visible ray band and/or ultraviolet ray band. The first light emitting structure 120 includes semiconductor material having the compositional formula of $In_xAl_yGa_{1-x-y}N$ ($0 \leq x \leq 1$, $0 \leq y \leq 1$, $0 \leq x+y \leq 1$). For instance, the first light emitting structure 120 may include one selected from the group consisting of GaN, AlN, AlGaN, InGaN, InN, InAlGaN, AlInN, AlGaAs, GaP, GaAs, GaAsP, and AlGaInP.

Figure 3:
FIG. 3 is a side sectional view showing an example of a light emitting structure shown in FIG. 1.

As shown in FIG. 3, the first light emitting structure 120 includes the stack structure of a first conductive type semiconductor layer L1 doped with first conductive dopant, an active layer L2, and a second conductive type semiconductor layer L3 doped with second conductive dopant, which may be stacked sequentially or vice versa. According to the embodiment, the active layer L2 is formed under the first conductive type semiconductor layer L1 and the second conductive type semiconductor layer L3 is formed under the active layer L2. The first conductive type semiconductor layer is an n type semiconductor layer, wherein the n type semiconductor layer includes N type dopant, such as Si, Ge, Sn, Se, or Te. The second conductive type semiconductor layer is a p type semiconductor layer, wherein the p type semiconductor layer includes P type dopant, such as Mg or Zn. The other way, the first conductive type may be a p-type and the second conductive type may be an n-type. The active layer L2 may have at least one of a single quantum well structure, a multiple quantum well structure, a quantum wire structure, and a quantum dot structure. The active layer L2 may have a stack structure including a well layer and a barrier layer, which are made from group III-V compound semiconductor materials. For example, the active layer L2 may have a stack structure of an InGaN well layer/GaN barrier layer, an InGaN well layer/AlGaN barrier layer or an InGaN well layer/InGaN barrier layer, but the embodiment is not limited thereto. A conductive clad layer may be formed on and/or under the active layer L2. The conductive clad layer may include a GaN-based semiconductor. The barrier layer may have band gap energy higher than that of the well layer, and the conductive clad layer may have band gap energy higher than that of the barrier layer. The embodiment may not limit the number of layers.

Figure 4:
FIG. 4 is a side sectional view showing another example of a light emitting structure shown in FIG. 1.

In addition, as shown in FIG. 4, the first light emitting structure 120 may further include an semiconductor layer, which has polarity opposite to that of the second conductive type semiconductor layer L3, under the second conductive type semiconductor layer L3. For example, when the second conductive type semiconductor layer is a p type semiconductor layer, the semiconductor layer is an n type semiconductor layer. Thus, the first light emitting structure 120 may include at least one of an N-P junction structure, a P-N junction structure, an N-P-N junction structure, and a P-N-P junction structure.

The first conductive type semiconductor layer L1 of the first light emitting structure 120 makes contact with the second transmittive electrode layer 118 and the conductive layer 116 and the second conductive type semiconductor layer L3 is disposed under the first adhesive layer 152. The transmittive electrode layer, the spacer 134 (see, FIG. 1) and the conductive layer can be further disposed between the first light emitting structure 120 and the first adhesive layer 152, and the embodiment is not limited thereto.

The first adhesive layer 152 can be formed on the first light emitting structure 120 and the first adhesive layer 152 is electrically connected to the second chip structure 105.

The light emitted from the first light emitting structure 120 is reflected and/or refracted between the first adhesive layer 152 and the first reflective layer 112 so that the light is emitted in the substantially lateral direction (for example, the horizontal direction). A concave-convex pattern can be formed on the surface of the first conductive type semiconductor layer and/or the second conductive type semiconductor layer of the first light emitting structure 120. The concave-convex pattern may vary the radiation angle of the light.

The first adhesive layer 152 can be bonded by using eutectic metal having a single layer or a multiple layer. The eutectic metal can bond an alloy, such as Au/Sn, SnPb or Pb-free solder, through the eutectic process, and the embodiment is not limited thereto.

The second adhesive layer 154 of the second chip structure 105 is bonded onto the first adhesive layer 152. The chip structures 102 and 105 may not include the first and second adhesive layers 152 and 154, but the embodiment is not limited thereto.

The second chip structure 105 includes a second reflective layer 156, the third transmittive electrode layer 158, and the second light emitting structure 160.

The second reflective layer 156 may include one selected from the group consisting of Ag, Ni, Al, Rh, Pd, Ir, Ru, Mg, Zn, Pt, Au, Hf and combination thereof. The second reflective layer 156 may include metallic material having reflectivity of 50% or above.

The third transmittive electrode layer 158 is disposed on the second reflective layer 156 and prepared in the form of a layer or a pattern. The third transmittive electrode layer 158 may include at least one selected from the group consisting of ITO (indium tin oxide), IZO (indium zinc oxide), IZON (IZO nitride), AZO (aluminum zinc oxide), IZTO (indium zinc tin oxide), IAZO (indium aluminum zinc oxide), IGZO (indium gallium zinc oxide), IGTO (indium gallium tin oxide), and ATO (antimony tin oxide), but the embodiment is not limited thereto.

The second light emitting structure 160 is formed on the third transmittive electrode layer 158 and includes the stack structure identical to or different from that of the first light emitting structure 120. The second light emitting structure 160 includes the stack structure as shown in FIG. 3 or 4. For instance, the second light emitting structure 160 may include the stack structure having the first conductive type semiconductor layer L1 doped with the first conductive dopant, the active layer L2 and the second conductive type semiconductor layer L3 doped with the second conductive dopant. The second conductive type semiconductor layer is a p type semiconductor layer and the first conductive type semiconductor layer is an n type semiconductor layer, which are similar to the structure of the first light emitting structure 120.

The second conductive type semiconductor layer L3, the active layer L2 and the first conductive type semiconductor layer L1 are sequentially arranged from the third transmittive electrode layer 158 of the second light emitting structure 160. The layer arrangement of the second light emitting structure 160 may be inversed to that of the first light emitting structure 120. If the N type layer (or P type layer) is positioned at the uppermost layer of the first light emitting structure 120, the P type layer (or N type layer) is positioned at the lowermost layer of the second light emitting structure 160, such that the current may flow through the first and second light emitting structures 120 and 160.

A roughness or a pattern 161 can be formed on the top surface of the second light emitting structure 160. The roughness or the pattern 161 can improve the external quantum efficiency.

A light extraction structure, such as a concave-convex structure or an air gap structure, can be selectively provided in the first light emitting structure 120 and/or the second light emitting structure 160, but the embodiment is not limited thereto.

The electrode 162 is disposed on the second light emitting structure 160 so as to be electrically connected to the second light emitting structure 160. The electrode 162 may be prepared in the form of a layer or a plurality of arms (or fingers) and may include a pad. The electrode 162 can be formed with a single layer structure or a multiple layer structure by using transmittive electrode material and/or metallic material. A concave-convex pattern 162A can be formed on the top surface of the electrode 162.

A flat surface may be formed on a part of a top surface of the second light emitting structure 160. The electrode 162 is formed on the flat surface, but the embodiment is not limited thereto.

An insulating layer 164 is formed around the second light emitting structure 160 in order to prevent the interlayer short from occurring at the lateral side of the second light emitting structure 160. The insulating layer 164 may include insulating material, such as $SiO_2$, $SiO_x$, $SiO_xN_y$, $Si_3N_4$, $Al_2O_3$, or $TiO_2$, but the embodiment is not limited thereto.

The first chip structure 102 provided at the lower portion of the light emitting device 100 and the second chip structure 105 provided at the upper portion of the light emitting device 100 may emit the light having same wavelength band or different wavelength bands. For instance, one of the first and second chip structures 102 and 105 may emit the light having the visible ray band, such as the light having red, green or blue color, or may emit the light having the ultraviolet ray band. That is, the first chip structure 102 may emit the light having the red or green color and the second chip structure 105 may emit the light having the blue color. In addition, the first chip structure 102 may emit the light having the ultraviolet ray band and the second chip structure 105 may emit the light having the blue color. Therefore, the light having same wavelength band or different wavelength bands can be emitted by using the plural chip structures. The quantity of light of the light emitting device 100 can be increased by 1.5 times or above as compared with the light emitting device having only one chip structure. In addition, the light emitting device 100 can emit the light having a plurality of wavelength bands.

Figure 2:
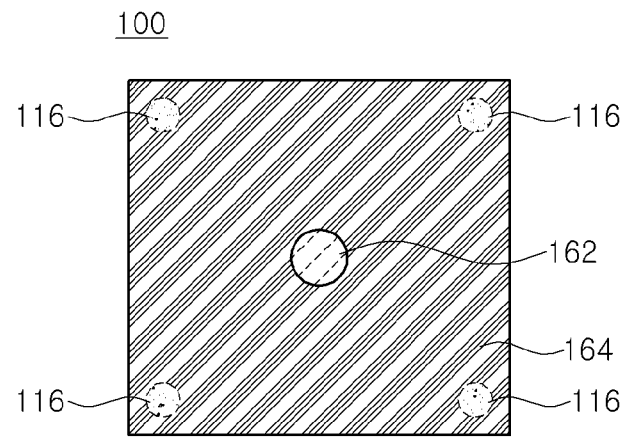
FIG. 2 is a plan view of FIG. 1.

FIG. 2 is a plan view of FIG. 1.

Referring to FIG. 2, a plurality of conductive layers 116 are formed in the first chip structure 102 and at least one electrode 162 is formed in the second chip structure 105. The conductive layers are vertically offset from the electrode 162, but the embodiment is not limited thereto. The conductive layers 116 can diffuse the power being supplied to the first light emitting structure 120.

Figure 5:
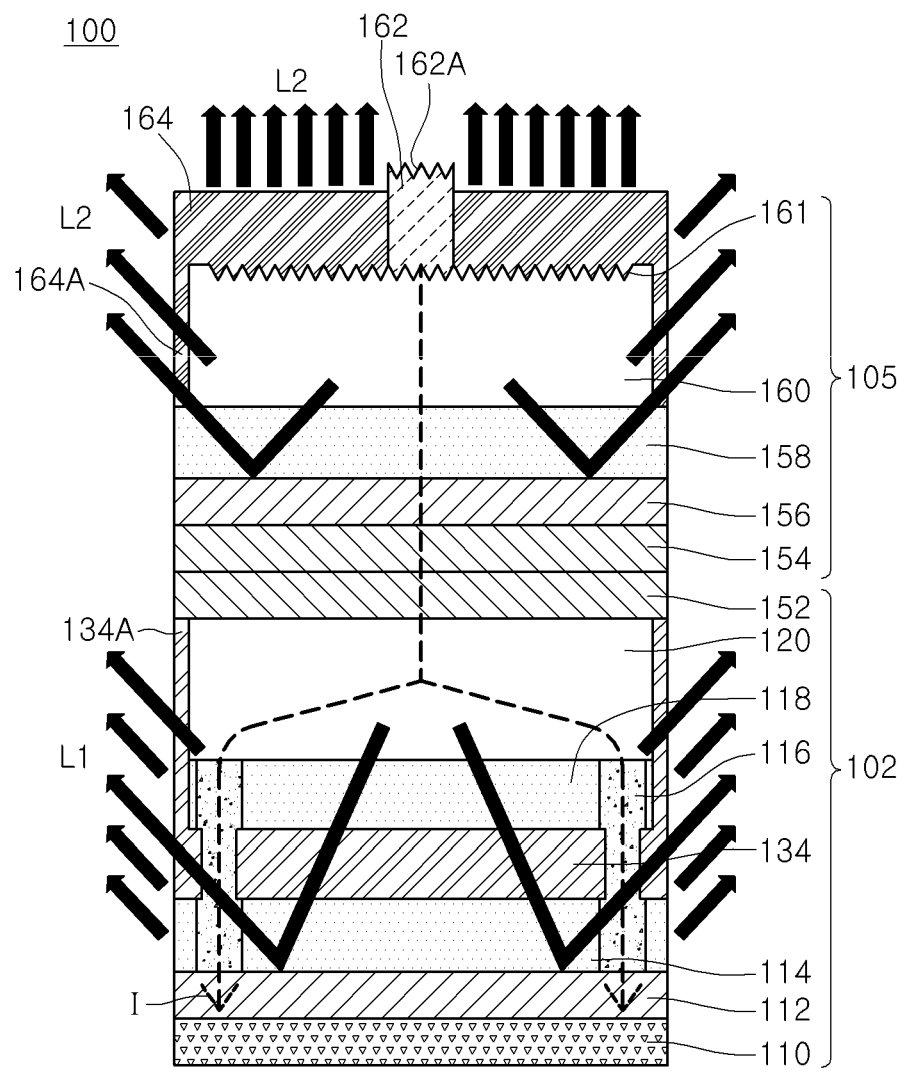
FIG. 5 is a sectional view showing distribution of light emitted from a light emitting device shown in FIG. 1.

FIG. 5 is a view showing distribution of light emitted from the light emitting device shown in FIG. 1.

Referring to FIG. 5, the current I supplied from the electrode 162 of the second chip structure 105 passes through the second light emitting structure 160, the second reflective layer 156, and the second adhesive layer 154, and then the current I is transferred to the conductive support member 110 via the first adhesive layer 152, the first light emitting structure, the conductive layer 116 and the first reflective layer 112 of the first chip structure.

The first light emitting structure 120 of the first chip structure 102 and the second light emitting structure 160 of the second chip structure 105 may emit the light. That is, the first light emitting structure 120 emits the first light L1, which is reflected from the first adhesive layer 152 and the first reflective layer 112 or refracted by the transmittive layer 134 and the first and second transmittive electrode layers 114 and 118. Thus, the first light L1 emitted from the first chip structure 102 is mainly emitted in the lateral direction.

The second light emitting structure 160 of the second chip structure 105 emits the second light L2, which is reflected or refracted by the second reflective layer 156 and the roughness 161, so that the second light L2 is emitted trough the lateral side and the top surface of the second chip structure 105.

The first light L1 of the first chip structure 102 has the wavelength band identical to or different from that of the second light L2 of the second chip structure 105. For instance, the first light L1 may have the wavelength band of red or green light, and the second light L2 may have the wavelength band of blue light. The single light emitting device 100 can emit the light having single color or plural colors. When the light emitting device 100 emits the light having the plural colors, the colors may be mixed with each other. The mixed light may have white color or other colors.

FIGS. 6 to 20 are sectional views showing the procedure for manufacturing the light emitting device shown in FIG. 1.

Figure 6:
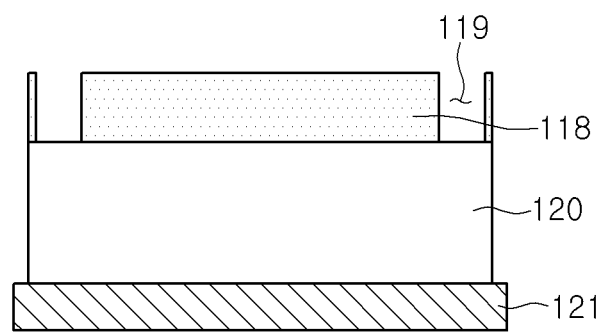
FIGS. 6 to 20 are sectional views showing the procedure for manufacturing a light emitting device shown in FIG. 1.
Figure 7:
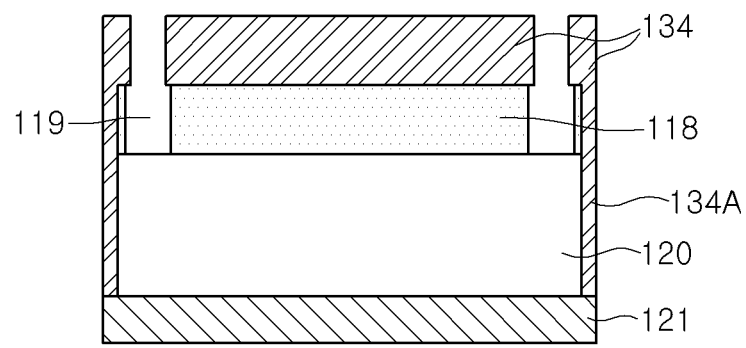

Referring to FIGS. 6 and 7, a first growth substrate 121 is loaded into growth equipment and the first light emitting structure 120 is formed on the first growth substrate 121 by using a plurality of compound semiconductors. The growth equipment may be selected from the group consisting of E-beam evaporator, PVD (physical vapor deposition), CVD (chemical vapor deposition), PLD (plasma laser deposition), dual-type thermal evaporator, sputtering, and MOCVD (metal organic chemical vapor deposition). However, the embodiment is not limited to the above growth equipment.

The first growth substrate 121 may include one selected from the group consisting of Al2O3, GaN, SiC, ZnO, Si, GaP, InP, GaAs and $Ga_2O_3$. A concave-convex structure can be formed on the top surface of the substrate 121. The concave-convex structure may include a lens structure or a stripe structure.

In addition, a crystalline structure or a specific structure, such as a pattern structure or a column structure for improving the light extraction efficiency, can be formed on the first growth substrate 121 by using a group II to group VI compound semiconductor.

The buffer layer and/or the undoped semiconductor layer can be formed on the first growth substrate 121. The buffer layer may reduce the lattice constant difference between the first growth substrate 121 and the compound semiconductor. For instance, the buffer layer may include the group III-V compound semiconductor, such as GaN, AlN, AlGaN, InGaN, InN, InAlGaN, AlInN, AlGaAs, GaP, GaAs, GaAsP, or AlGaInP. The undoped semiconductor layer may include a GaN-based semiconductor layer, but the embodiment is not limited thereto. For the purpose of convenience, the following description will be made on the assumption that the first light emitting structure 120 is formed on the first growth substrate 121.

As shown in FIG. 3, the first light emitting structure 120 includes the first conductive type semiconductor layer L1, the active layer L2, and the second conductive type semiconductor layer L3. The first conductive type semiconductor layer L1 includes the group III-V compound semiconductor doped with the first conductive dopant. For instance, the first conductive type semiconductor layer L1 includes one selected from the group consisting of GaN, AlN, AlGaN, InGaN, InN, InAlGaN, AlInN, AlGaAs, GaP, GaAs, GaAsP, and AlGaInP. The active layer L2 is formed on the first conductive type semiconductor layer L1 and includes the group III-V compound semiconductor. The active layer L2 may have at least one of a single quantum well structure, a multiple quantum well structure, a quantum wire structure, and a quantum dot structure. The active layer L2 may have a stack structure including a well layer and a barrier layer, which are made from group III-V compound semiconductor materials. For example, the active layer L2 may have a stack structure of an InGaN well layer/GaN barrier layer, an InGaN well layer/AlGaN barrier layer or an InGaN well layer/InGaN barrier layer, but the embodiment is not limited thereto. A conductive clad layer may be formed on and/or under the active layer L2. The conductive clad layer may include a GaN-based semiconductor. The barrier layer may have band gap energy higher than that of the well layer, and the conductive clad layer may have band gap energy higher than that of the barrier layer.

In the first light emitting structure 120, the first conductive type semiconductor layer is an N type semiconductor layer and the second conductive type semiconductor layer is a P type semiconductor layer, or vice versa. In addition, as shown in FIG. 4, an N type semiconductor layer L1 can be further formed on the second conductive type semiconductor layer L3. Thus, the first light emitting structure 120 may include at least one of an N-P junction structure, a P-N junction structure, an N-P-N junction structure, and a P-N-P junction structure.

The outer peripheral portion of the first light emitting structure 120 can be etched along the chip boundary area. The etching process is performed to separate the chip boundary area and the edge part of the first growth substrate 121 can be exposed through the etching process.

The second transmittive electrode layer 118 is formed on the first light emitting structure 120. The second transmittive electrode layer 118 can be prepared in the form of a layer or a pattern. The second transmittive electrode layer 118 may come into ohmic contact with the second conductive type semiconductor layer of the first light emitting structure 120. The second transmittive electrode layer 118 can be formed by using oxide-based or nitride-based conductive materials. For instance, the second transmittive electrode layer 118 may include at least one selected from the group consisting of ITO (indium tin oxide), IZO (indium zinc oxide), IZON (IZO nitride), AZO (aluminum zinc oxide), IZTO (indium zinc tin oxide), IAZO (indium aluminum zinc oxide), IGZO (indium gallium zinc oxide), IGTO (indium gallium tin oxide), and ATO (antimony tin oxide).

The second transmittive electrode layer 118 may have a multiple layer structure. For instance, the second transmittive electrode layer 118 may have the stack structure including a conductive oxide layer and a metal layer, such as Ag, Ni, Al, Rh, Pd, Ir, Ru, Mg, Zn, Pt, Au or Hf. The stack structure may include IZO/Ni, AZO/Ag, IZO/Ag/Ni, or AZO/Ag/Ni. The second transmittive electrode layer 118 comes into ohmic contact with the first light emitting structure 120, but the embodiment is not limited thereto.

A plurality of holes 119 are formed in the second transmittive electrode layer 118 by a mask pattern and the holes 119 are spaced apart from each other.

The transmittive layer 134 is formed on the second transmittive electrode layer 118. The transmittive layer 134 covers the top surface of the second transmittive electrode layer 118 and the outer peripheral portion of the first light emitting structure 120. The transmittive layer 134 can be formed by using insulating material. For instance, the transmittive layer 134 may include one selected from the group consisting of $SiO_2$, $SiO_x$, $SiO_xN_y$, $Si_3N_4$, $Al_2O_3$, and $TiO_2$, but the embodiment is not limited thereto.

The part 134A of the transmittive layer 134 includes a insulating material and a conductive material, such as ITO, can be formed on the second transmittive electrode layer 118.

The transmittive layer 134 serves as a spacer. That is, the transmittive layer 134 provides a space such that the light emitted from the first light emitting structure 120 can be laterally guided. The refractive index of the transmittive layer 134 is different from that of the second transmittive electrode layer 118. The transmittive layer 134 refracts the incident light so that the light, which will be extinguished in the light emitting device, can be emitted in the horizontal direction.

Figure 8:
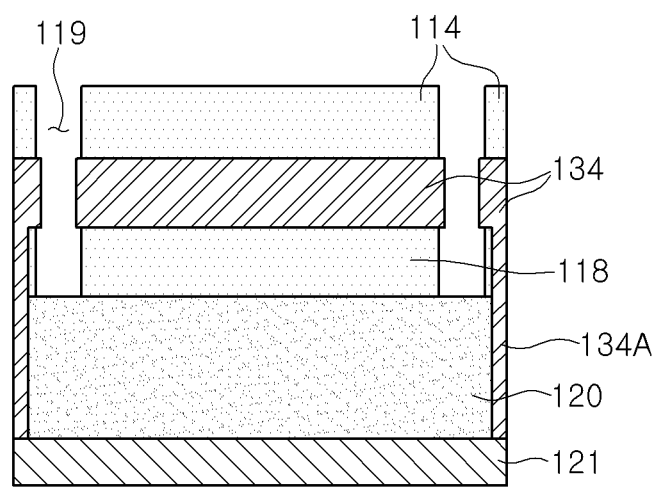
Figure 9:
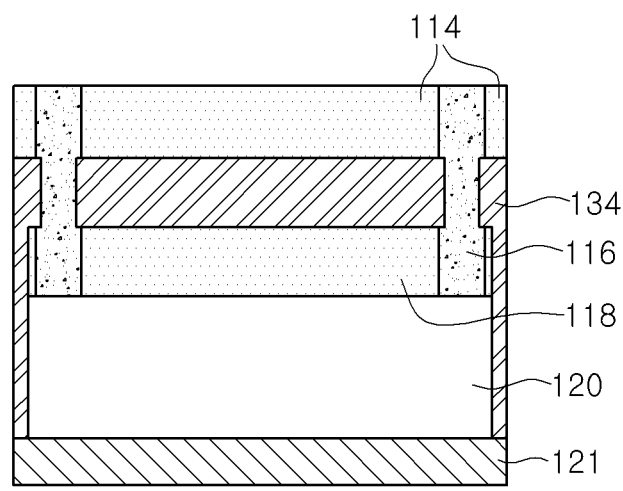

Referring to FIGS. 8 and 9, the first transmittive electrode layer 114 is formed on the transmittive layer 134. The first transmittive electrode layer 114 may include material the same as that of the second transmittive electrode layer 118, but the embodiment is not limited thereto. The first transmittive electrode layer 114 can be omitted.

The holes 119 extend through the second transmittive electrode layer 118, the transmittive layer 134 and the first transmittive electrode layer 114. The holes 119 may have the same diameter or different diameters. For instance, an upper diameter of the hole 119 may be larger than a lower diameter of the hole 119, but the embodiment is not limited thereto.

The conductive layer 116 may be formed in the hole 119 such that the conductive layer 116 can be electrically connected to the first transmittive electrode layer 114, the second transmittive electrode layer 118, and the top surface of the second conductive type semiconductor layer of the first light emitting structure 120. The conductive layer 116 may come into ohmic contact with the second conductive type semiconductor layer.

The conductive layer 116 may include at least one selected from the group consisting of ITO (indium tin oxide), IZO (indium zinc oxide), IZON (ITO nitride), AZO (aluminum zinc oxide), IZTO (indium zinc tin oxide), IAZO (indium aluminum zinc oxide), IGZO (indium gallium zinc oxide), IGTO (indium gallium tin oxide), ATO (antimony tin oxide), Ag, Ni, Al, Rh, Pd, Ir, Ru, Mg, Zn, Pt, Au, Hf, and combination thereof, but the embodiment is not limited thereto.

Figure 10:
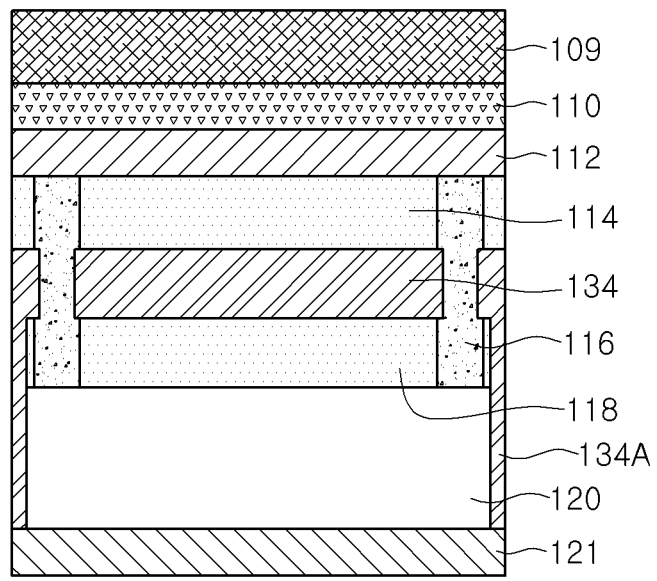

Referring to FIGS. 9 and 10, the first reflective layer 112 is formed on the conductive layer 116 and the transmittive electrode layer 114, the conductive support member 110 is formed on the first reflective layer 112, and a sacrifice substrate 109 is formed on the conductive support member 110.

The first reflective layer 112 includes reflective material. For instance, the first reflective layer 112 includes at least one selected from the group consisting of Ag, Ni, Al, Rh, Pd, Ir, Ru, Mg, Zn, Pt, Au, Hf and combination thereof. The first reflective layer 112 reflects the incident light. The conductive support member 110 includes Cu, Au, Ni, Mo, Cu—W, or a carrier wafer, such as Si, Ge, GaAs, ZnO, SiC, SiGe, or GaN. The conductive support member 110 can be formed through the coating scheme or can be prepared as a sheet.

The sacrifice substrate 109 is a grip substrate including material suitable for LLO (laser lift off), such as glass or sapphire. The sacrifice substrate 109 can be attached or deposited onto the conductive support member 110, and the embodiment is not limited thereto.

Figure 11:
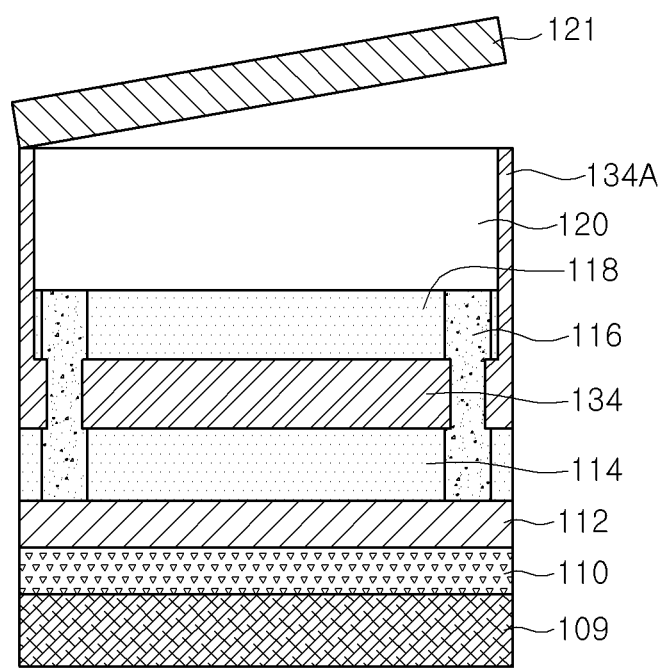

Referring to FIGS. 10 and 11, after turning on the chip structure, the sacrifice substrate 109 is placed on the base and the first growth substrate 121 is removed. The first growth substrate 121 can be removed by irradiating laser beam having a predetermined wavelength onto the first growth substrate 121 or by performing the wet etching process, but the embodiment is not limited thereto.

Figure 12:
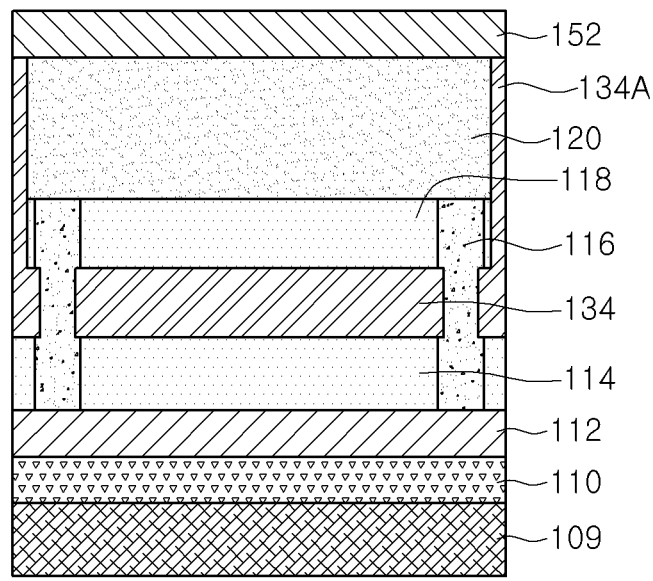

Referring to FIGS. 11 and 12, after the first growth substrate 121 has been removed, the first adhesive layer 152 is formed on the first conductive type semiconductor layer of the first light emitting structure 120. The first adhesive layer 152 can be formed by using a eutectic metal alloy, such as Au/Sn, SnPb or Pb-free solder, but the embodiment is not limited thereto. Thus, the first chip structure 102A is obtained.

Figure 13:
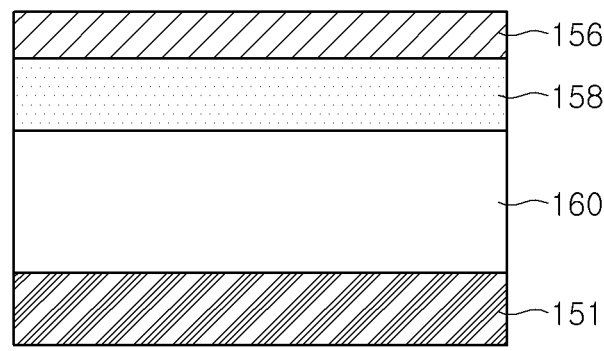
Figure 14:
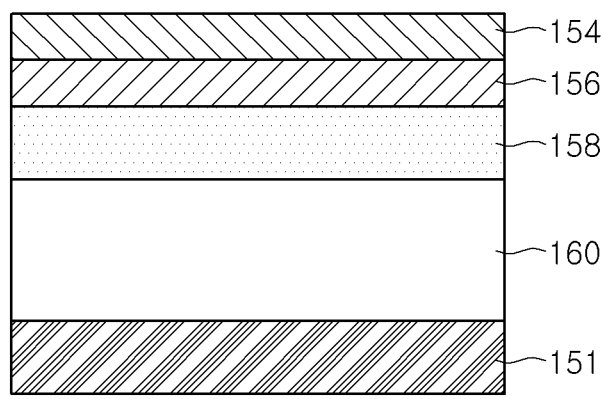

FIGS. 13 and 14 are sectional view showing the procedure for manufacturing the second chip structure.

Referring to FIGS. 13 and 14, the second chip structure includes the second light emitting structure 160 formed on a second growth substrate 151, the third transmittive electrode layer 158 formed on the second light emitting structure 160, and a second reflective layer 156 formed on the third transmittive electrode layer 158. The second light emitting structure 160 has a plurality of semiconductor layers including the group III-V compound semiconductor. In addition, the second light emitting structure 160 may include the stack structure of the first conductive type semiconductor layer L1, the active layer L2 and the second conductive type semiconductor layer L3 as shown in FIG. 3. Another semiconductor layer, such as a compound semiconductor layer including the group II to group VI compound semiconductor layer, can be formed on/under the second light emitting structure 160, and the embodiment is not limited thereto. The structure of the second light emitting structure 160 is similar to that of the first light emitting structure 120, so the detailed description thereof will be omitted.

The third transmittive electrode layer 158 may include material the same as that of the first transmittive electrode layer 114 and can be prepared in the form of a layer or a pattern. The second reflective layer 156 may include material the same as that of the first reflective layer 112. The third transmittive electrode layer 158 can be omitted, but the embodiment is not limited thereto.

The second adhesive layer 154 is formed on the second reflective layer 156. The second adhesive layer 154 may include material the same as that of the first adhesive layer 152, and the embodiment is not limited thereto. Thus, the second chip structure 105A is obtained.

FIGS. 15 to 20 are sectional views showing the procedure for manufacturing the light emitting structure by bonding the first chip structure with the second chip structure.

Figure 15:
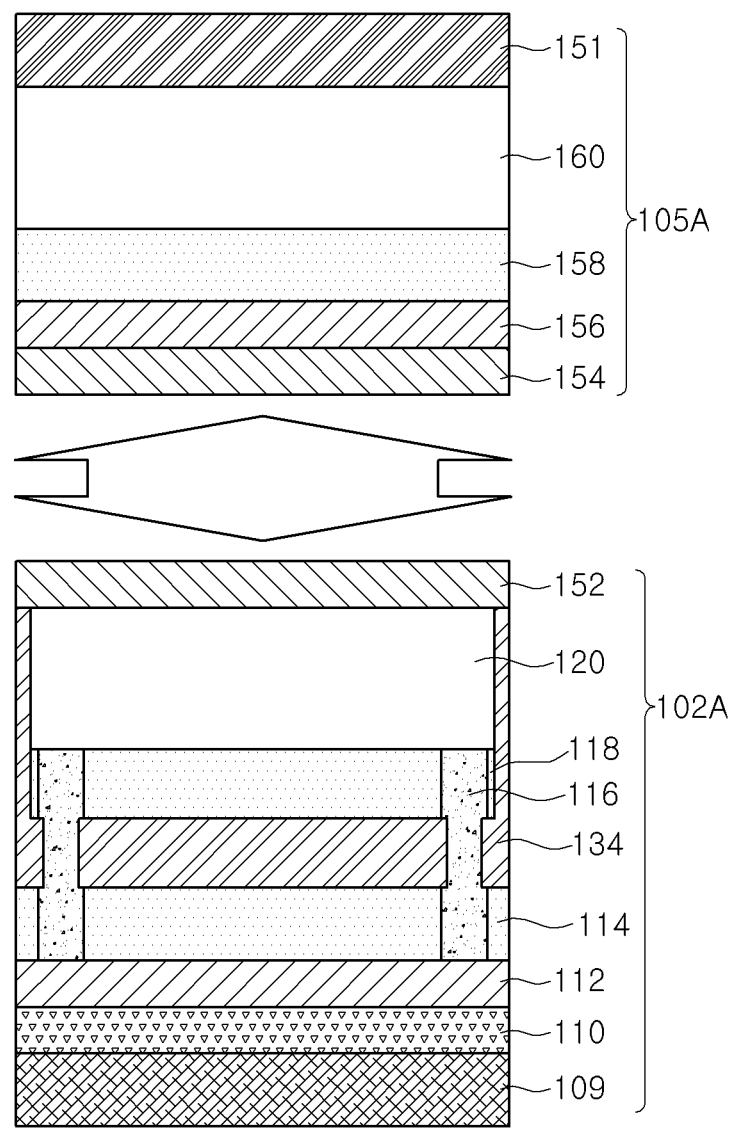

Referring to FIG. 15, after placing the second chip structure 105A on the first chip structure 102A, the first adhesive layer 152 is bonded with the second adhesive layer 154. The first and second adhesive layers 152 and 154 can be bonded through the eutectic bonding process, but the embodiment is not limited thereto.

Figure 16:
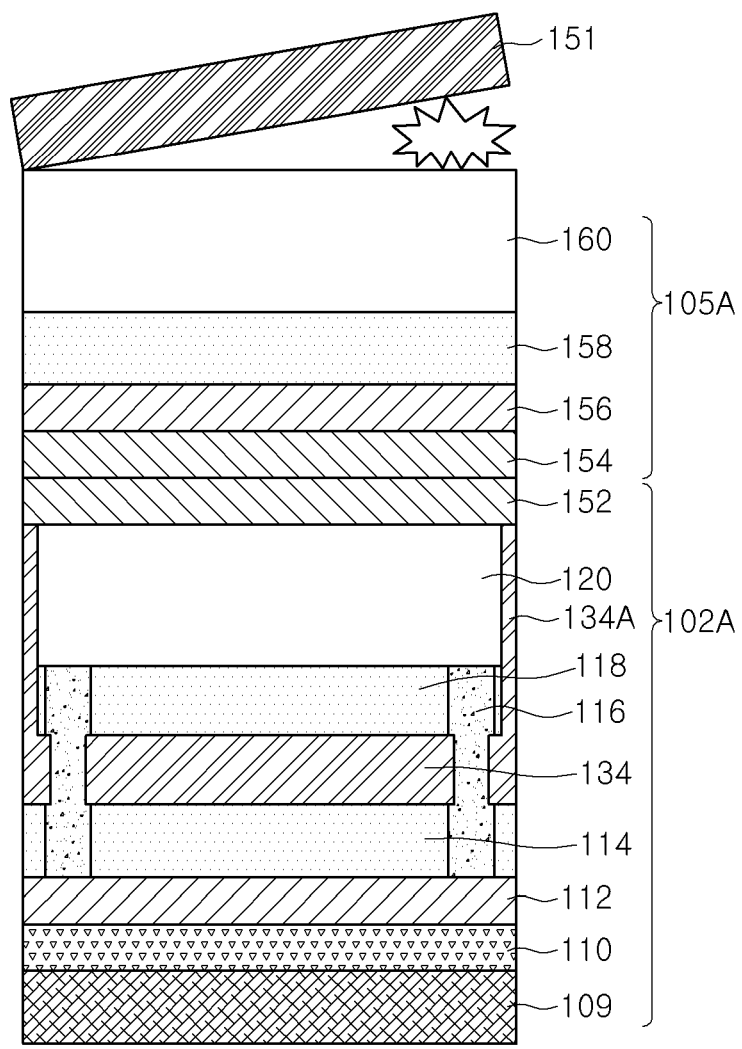
Figure 17:
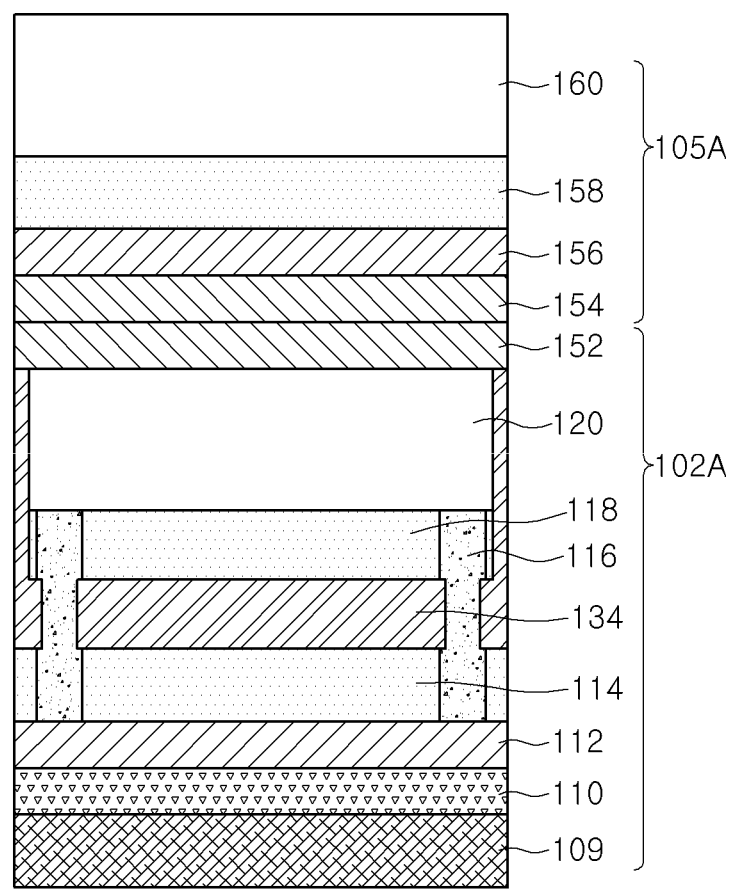

Referring to FIGS. 16 and 17, the second growth substrate 151 is removed from the second chip structure 105A. The second growth substrate 151 can be removed through the physical and/or chemical scheme. The physical scheme may include the LLO scheme and the chemical scheme may include the wet etching scheme. According to the wet etching scheme, wet etchant is injected into a layer (for example, a buffer layer including ZnO) formed between the second growth substrate 151 and the second light emitting structure 160.

Figure 18:
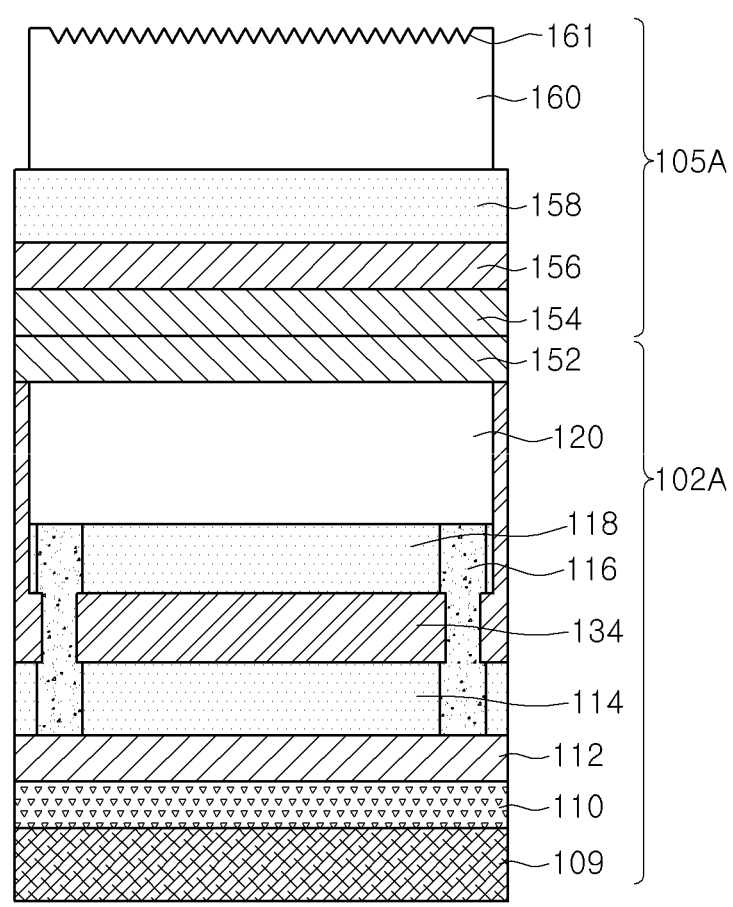

Referring to FIG. 18, after the second growth substrate 151 has been removed from the second chip structure 105A, the roughness or the pattern 161 is formed on the surface of the second light emitting structure 160, that is, on the top surface of the first conductive type semiconductor layer, thereby forming the structure capable of improving the external quantum effect. Then, the chip boundary area, that is, the outer peripheral portion of the second light emitting structure 160 is removed through the etching process.

Figure 19:
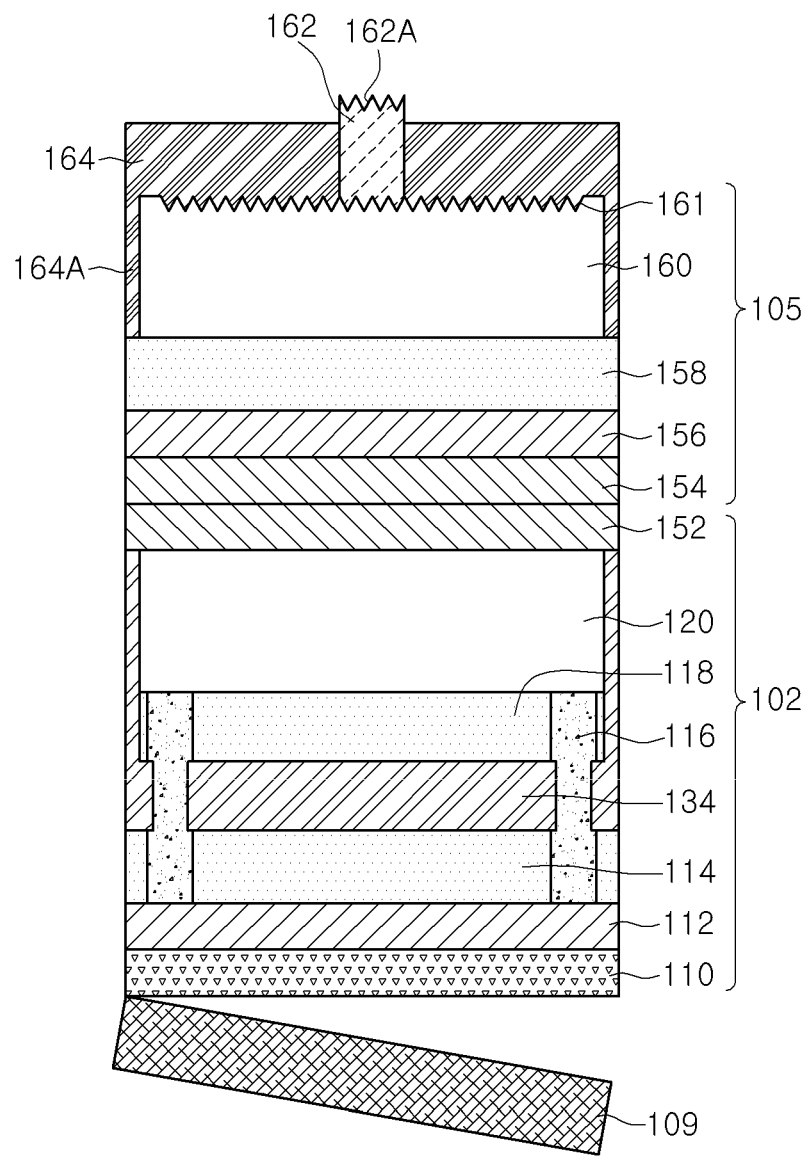
Figure 20:
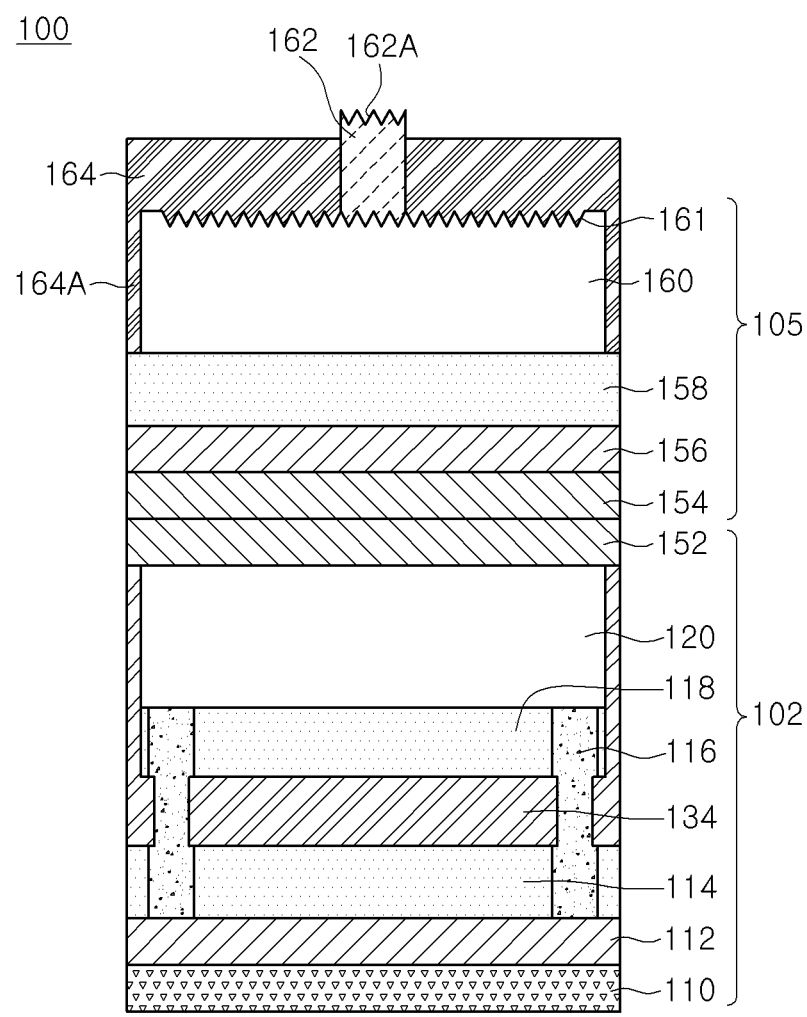

Referring to FIGS. 19 and 20, the transmittive electrode layer and/or the electrode 162 is formed on the second light emitting structure of the second chip structure 105A. Single electrode 162 or plural electrodes 162 can be provided in the form of an arm (or fingers) shape. Then, a roughness pattern 162A is formed on the electrode 162. The electrode 162 may be formed on the flat top surface of the second light emitting structure 160, but the embodiment is not limited thereto.

The insulating layer 164 is formed at an outer portion of the second light emitting structure 160. The insulating layer 164 is formed on the whole area of the second light emitting structure 160 except for the region where the electrode 162 of the second light emitting structure 160 will be formed later.

The insulating layer prevents the moisture intrusion and interlayer short from occurring at the outer side of the second light emitting structure 160.

Then, the sacrifice substrate 109 is removed from the base of the first chip structure 102. For instance, the sacrifice substrate 109 can be removed through a debonding scheme. After the sacrifice substrate 109 has been removed, the conductive support member 110 is disposed on the base of the first chip structure 102.

The first chip structure 102 is integrally bonded with the second chip structure 105, so that the light emitting device 100 having the chip structures 102 and 105 can be provided.

The light emitting device 100 emits the light in the lateral direction through the first chip structure 102 and emits the light in the lateral and upward directions through the second chip structure 105.

The first and second chip structures 102 and 105 may emit the light having the visible ray band, such as red, green or blue light, or the UV band. Thus, the first and second chip structures 102 and 105 may emit the light having the same wavelength band or different wavelength bands. For instance, the light having a plurality of colors can be emitted from the light emitting device and the light having the target color, such as white, can be achieved by mixing the colors of the light.

In the light emitting device, one or plural second chip structures 105 are disposed on the single first chip structure 102 and the first chip structure 102 is bonded with the second chip structure 105 so that the first chip structure 102 is electrically connected to the second chip structure 105.

In addition, one or one or plural second chip structures 105 can be disposed on the plural first chip structures 102 and the first chip structures 102 are bonded with the second chip structure 105 so that the first chip structures 102 are electrically connected to the second chip structure 105. The first chip structures 102 can be connected to the second chip structure 105 in series. Thus, plural chip structures 102 and 105 can be connected to each other in series in the single light emitting device.

The plural chip structures can be stacked in the two-layer structure or the three-layer structure with the same width or different widths.

In addition, the chip structures 102 and 105 of the light emitting device 100 can emit the light having the same wavelength band or different wavelength bands.

FIGS. 21 to 24 8 are views showing the procedure for manufacturing a light emitting device according to the second embodiment. In the second embodiment, the same reference numerals will be assigned to the same elements and description about the elements and structures that have already been explained in the first embodiment will be omitted in order to avoid redundancy.

Figure 21:
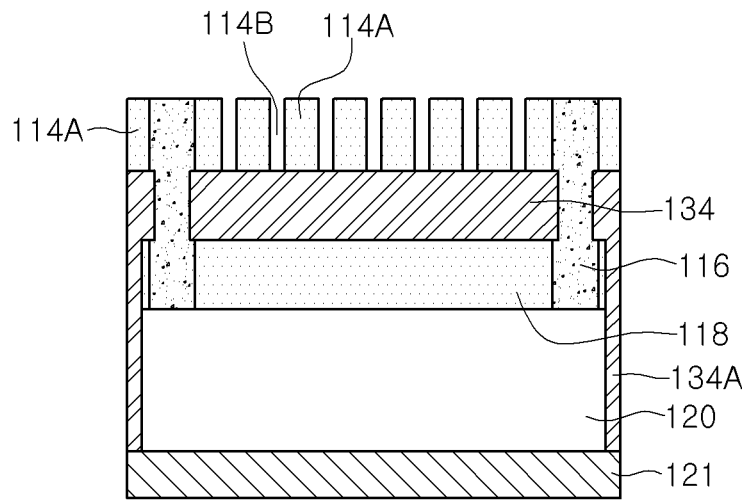
FIGS. 21 to 24 are sectional views showing the procedure for manufacturing a light emitting device according to a second embodiment.
Figure 22:
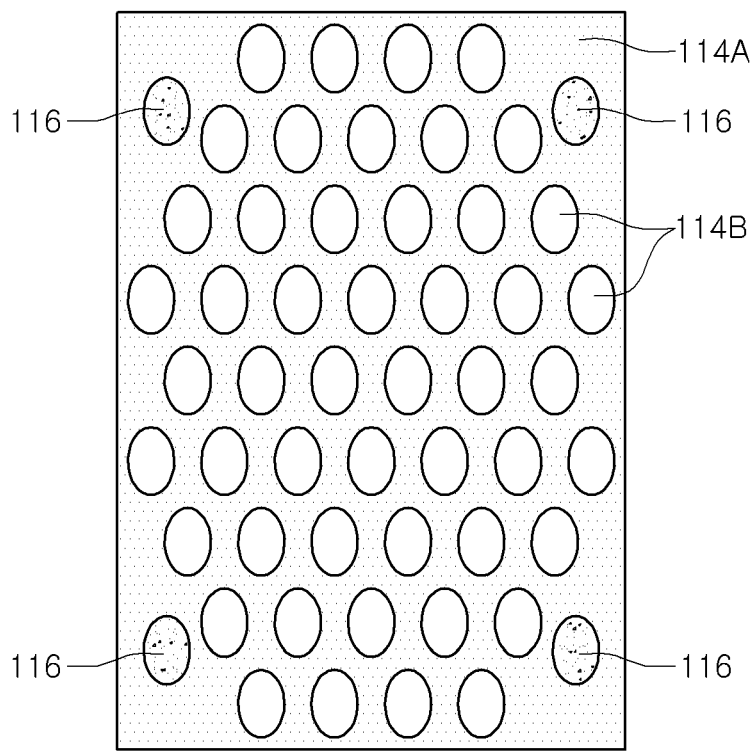
Figure 23:
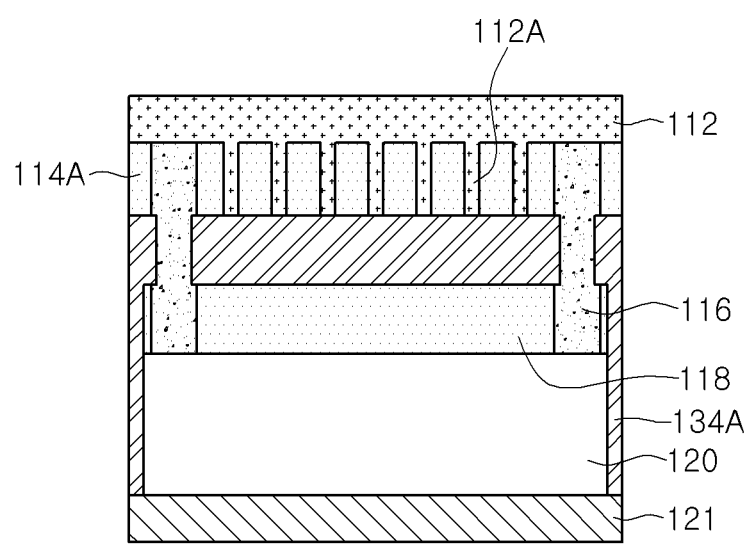

Referring to FIGS. 21 and 22, the structure of the first chip structure can be modified. That is, a first transmittive electrode layer 114A may include a plurality of holes 114B having a depth sufficient for exposing the light transmittive layer 134. However, the embodiment may not limit the depth of the hole 114B.

Referring to the plan view shown in FIG. 22, the holes 114B may have the circular shape, the oval shape or the polygonal shape. The holes 114B can be regularly or irregularly spaced apart from each other.

The first reflective layer 112 is formed on the first transmittive electrode layer 114A. Protrusions 112A of the first reflective layer 112 make contact with the transmittive layer 134 through the holes 114B of the first transmittive electrode layer 114A. The protrusions 112A of the first reflective layer 112 can be partially filled in the holes of the first transmittive electrode layer 114A and an air gap can be formed below the protrusions 112A. The first transmittive electrode layer 114A and the protrusions 112A of the first reflective layer 112 can improve the external quantum efficiency.

Figure 24:
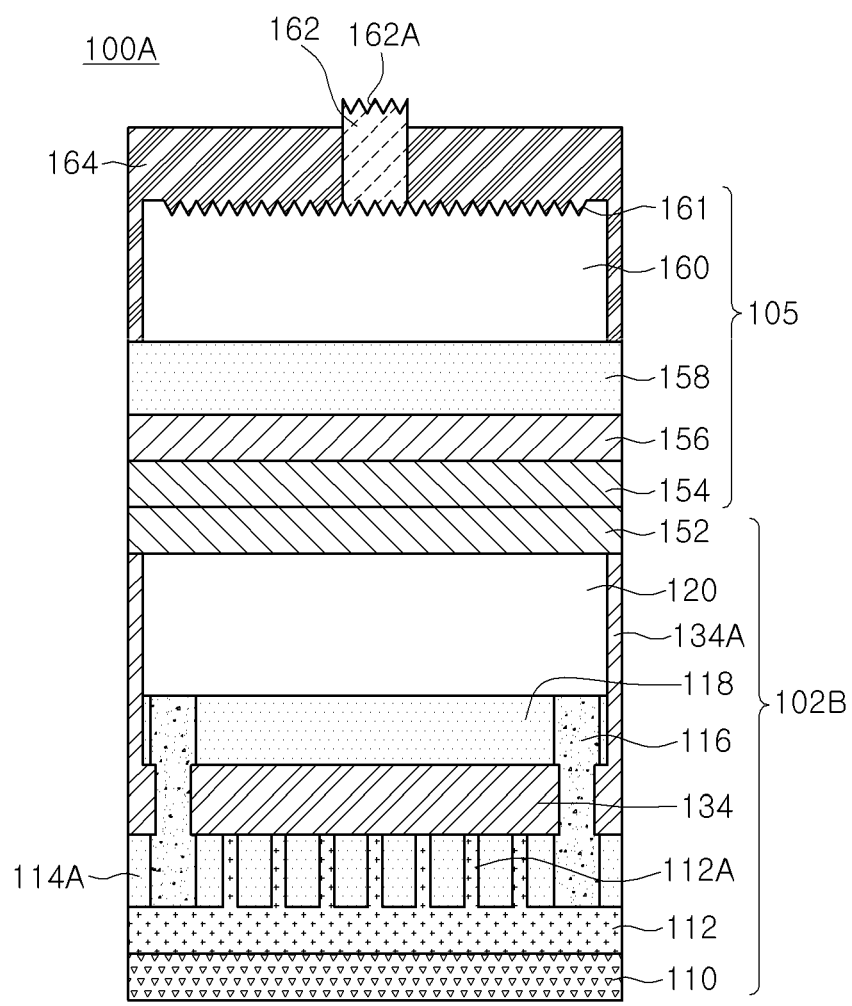

Referring to FIG. 24, the light emitting device 100A includes the first reflective layer 112 and the first transmittive electrode layer 114A at the lower portion of the first chip structure 102B. The first transmittive electrode layer 114A and the protrusions 112A of the first reflective layer 112 can improve the external quantum efficiency.

Figure 25:
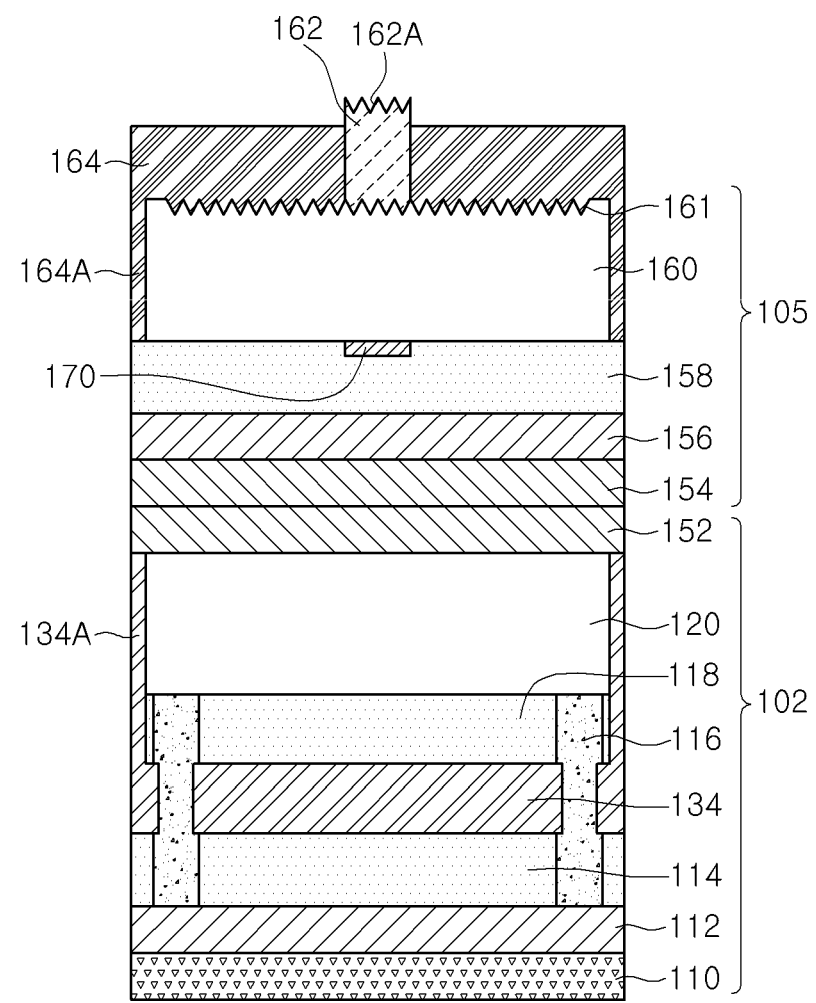
FIG. 25 is a sectional view showing a light emitting device according to a third embodiment.

FIG. 25 is a sectional view showing a light emitting device according to the third embodiment. The same reference numerals will be assigned to the same elements and description about the elements and structures that have already been explained in the first embodiment will be omitted in order to avoid redundancy.

Referring to FIG. 24, the light emitting device 100B includes a modified second chip structure 105 and a current blocking layer 170 is formed on the lower surface of the second light emitting structure 160. The current blocking layer 170 may overlap with the region of the electrode 162 in the vertical direction and may include material having conductivity lower than that of the third transmittive electrode layer 158. For instance, the current blocking layer 170 may include the insulating material, such as $SiO_2$, $SiO_x$, $SiO_xN_y$, $Si_3N_4$, $Al_2O_3$, $TiO_2$, but the embodiment is not limited thereto.

If the third transmittive electrode layer 158 is not formed, the current blocking layer 170 is formed on the top surface of the second reflective layer 156. In this case, the current blocking layer 170 may include one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), $SiO_2$, $SiO_x$, $SiO_xN_y$, $Si_3N_4$, $Al_2O_3$, and $TiO_2$.

Figure 26:
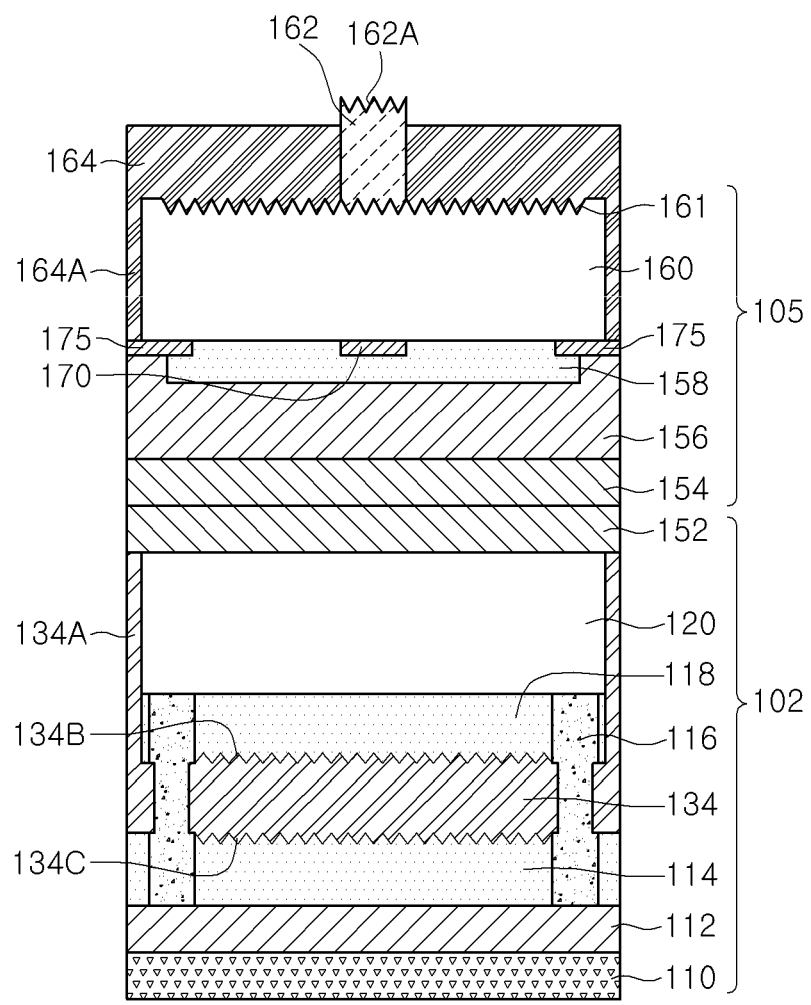
FIG. 26 is a sectional view showing a light emitting device according to a fourth embodiment.

FIG. 26 is a sectional view showing a light emitting device according to the fourth embodiment. The same reference numerals will be assigned to the same elements and description about the elements and structures that have already been explained in the previous embodiments will be omitted in order to avoid redundancy.

Referring to FIG. 26, the light emitting device 100C includes modified first and second chip structures 102 and 105. The current blocking layer 170 is formed on the lower surface of the second light emitting structure 160, the channel layer 175 is positioned around the lower surface of the second light emitting structure 160, and the lower surface of the channel layer 175 makes contact with the second reflective layer 156. The second reflective layer 156 is spaced apart from the light emitting structure 160 by the channel layer 175.

For instance, the channel layer 175 may include one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), $SiO_2$, $SiO_x$, $SiO_xN_y$, $Si_3N_4$, $Al_2O_3$, and $TiO_2$.

The roughness 134B and 134C can be formed on at least one side of the transmittive layer 134. The roughness 134B and 134C can improve the light extraction efficiency by varying the critical angle of the light. Such a roughness pattern can also be formed on at least one of the first reflective layer, the second reflective layer, the first transmittive electrode layer, the second transmittive electrode layer and the top surface of the light emitting structure, but the embodiment is not limited thereto.

Figure 27:
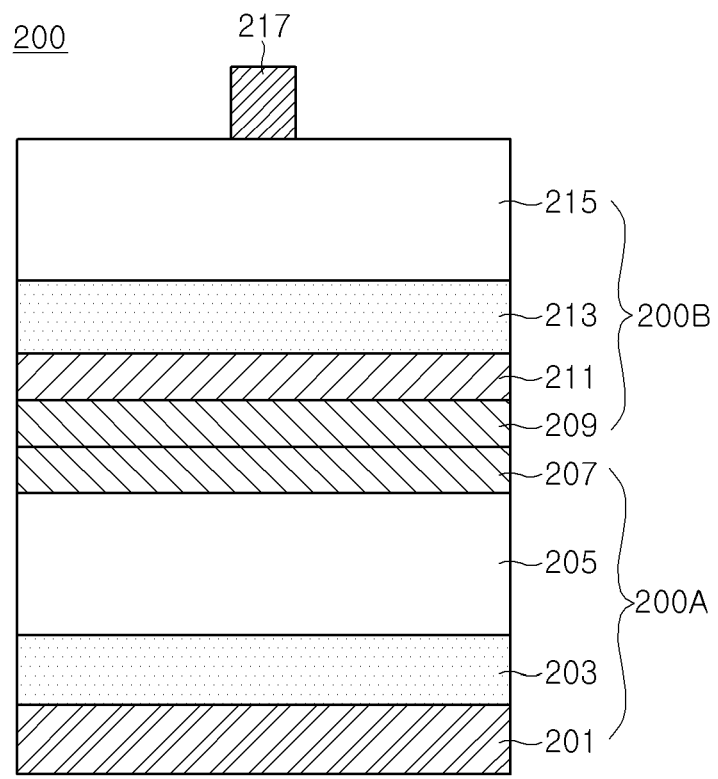
FIG. 27 is a sectional view showing a light emitting device according to a fifth embodiment.

FIG. 27 is a sectional view showing a light emitting device according to the fifth embodiment. The same reference numerals will be assigned to the same elements and description about the elements and structures that have already been explained in the previous embodiments will be omitted in order to avoid redundancy.

Referring to FIG. 27, the light emitting device 200 includes a first chip structure 200A and a second chip structure 200B. The first chip structure 200A includes a conductive support member 201, a first reflective layer 203, a first light emitting structure 205 and a first adhesive layer 207.

The second chip structure 200B includes a second adhesive layer 209, a second reflective layer 211, a second transmittive electrode layer 213, a second light emitting structure 215 and an electrode 217.

The first chip structure 200A can emit the light emitted from the first light emitting structure 205 in the lateral direction and can improve the external quantum efficiency by using a concave-convex structure (not shown). Such a structure has already been described in the previous embodiments.

The second chip structure 200B can emit the light emitted from the second light emitting structure 215 in the lateral and upward directions. A concave-convex structure can be formed in the second chip structure 200B to improve the external quantum efficiency, but the embodiment is not limited thereto.

FIG. 22 is a sectional view showing a light emitting device package according to the embodiment.

Figure 28:
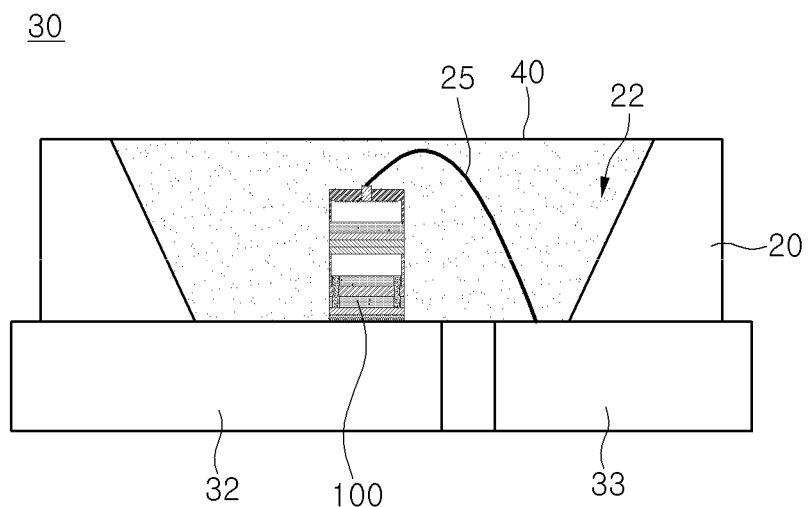
FIG. 28 is a sectional view showing a light emitting device package according to an embodiment.

Referring to FIG. 28, the light emitting device package 30 includes a body 20, first and second lead electrodes 32 and 33 formed on the body 20, the light emitting device 100 provided on the body 20 and electrically connected to the first and second lead electrodes 32 and 33 and a molding member 40 that surrounds the light emitting device 100.

The body 20 may be a conductive substrate including silicon, a synthetic resin substrate including PPA (Polyhthalamide), a ceramic substrate, an insulating substrate, or a metal substrate such as MCPCB (metal core printed circuit board). An inclined surface may be formed around the light emitting device 100. The body 20 may have a through hole structure, but the embodiment is not limited thereto.

A cavity 22 having a predetermined depth can be formed at an upper portion of the body 20. The lead electrodes 32 and 33 and the light emitting device 100 are arranged in the cavity 22. The light emitting device 100 can be replaced with another light emitting device according to the embodiments without limitation.

The body 20 may have a flat top surface. In this case, the cavity 22 is not formed.

The first and second lead electrodes 32 and 33 are electrically isolated from each other to supply power to the light emitting device 100. In addition, the first and second lead electrodes 32 and 33 reflect the light emitted from the light emitting device 100 to improve the light efficiency and dissipate heat generated from the light emitting device 100 to the outside.

The light emitting device 100 can be installed on the body 20 or the first and second lead electrodes 32 and 33.

The light emitting device 100 is identical to the light emitting device disclosed in the embodiment(s), in which the light emitting device is die-bonded onto the first lead electrode 32 and connected to the second lead electrode 33 through a wire 25.

The molding member 40 includes resin material, such as silicon or epoxy and surrounds the light emitting device 100 to protect the light emitting device 100. In addition, the molding member 40 may include phosphors to change the wavelength of the light emitted from the light emitting device 100. A lens is disposed on the molding member 40. The lens can make contact with the molding member 40 or not.

The light emitting device 100 emits the light having blue color and at least one type of phosphors can be provided in the molding member 40. In this case, the light intensity may be increased by about 1.5 times or more as compared with a chip having the size identical to the size of the light emitting device 100. When the light having a plurality of colors is emitted from the light emitting device 100, the light having the target color, such as white, can be achieved by mixing the colors of the light in the light emitting device package. In addition, the phosphors may not be added to the mold member 40 or the types of the phosphors added to the mold member 40 can be reduced.

The light emitting device package 30 is provided with at least one light emitting device disclosed in the embodiments. The embodiment may not limit the number of light emitting devices installed in the light emitting device package 30.

Although the top-view type light emitting device package is disclosed in the embodiment, the side-view type light emitting device package can be used to improve the heat dissipation, conductivity and reflective characteristics. According to the top-view type light emitting device package or the side-view type light emitting device package, the light emitting device is packaged by using the resin layer and then the lens is formed on the resin layer, but the embodiment is not limited thereto.

In addition, although it has been described that the light emitting device 100 is packaged as shown in FIG. 28, the light emitting device can be directly mounted on a board through a chip on board (COB) scheme while being covered with the molding member or the lens. A plurality of light emitting devices can be arranged on the board.

<Light Unit>

Figure 29:
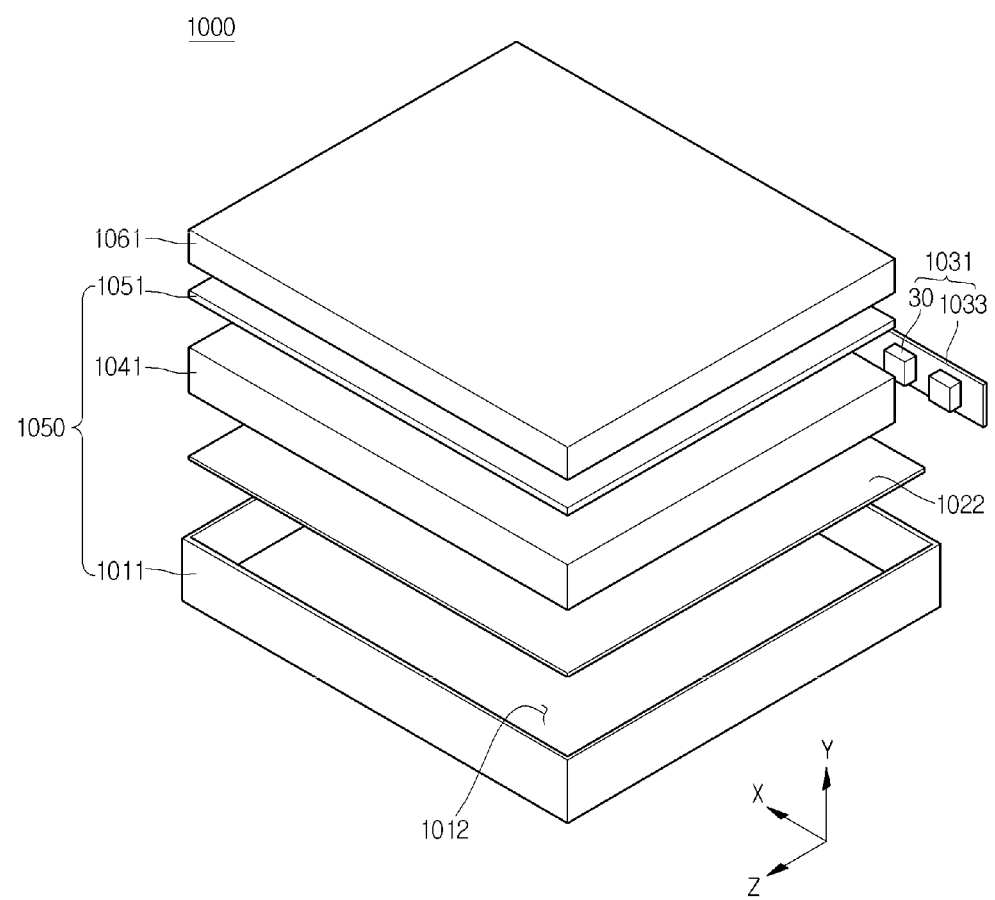
FIG. 29 is an exploded perspective view showing a display device according to an embodiment.
Figure 30:
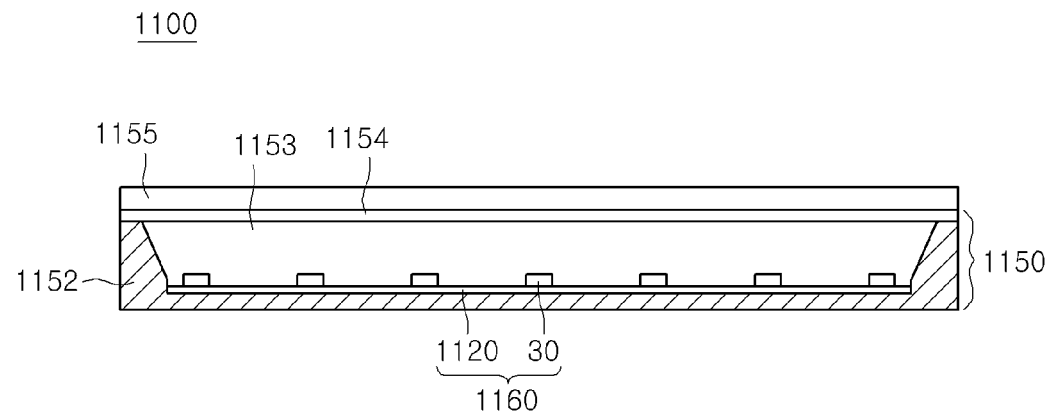
FIG. 30 is a sectional view showing a display device according to another embodiment.
Figure 31:
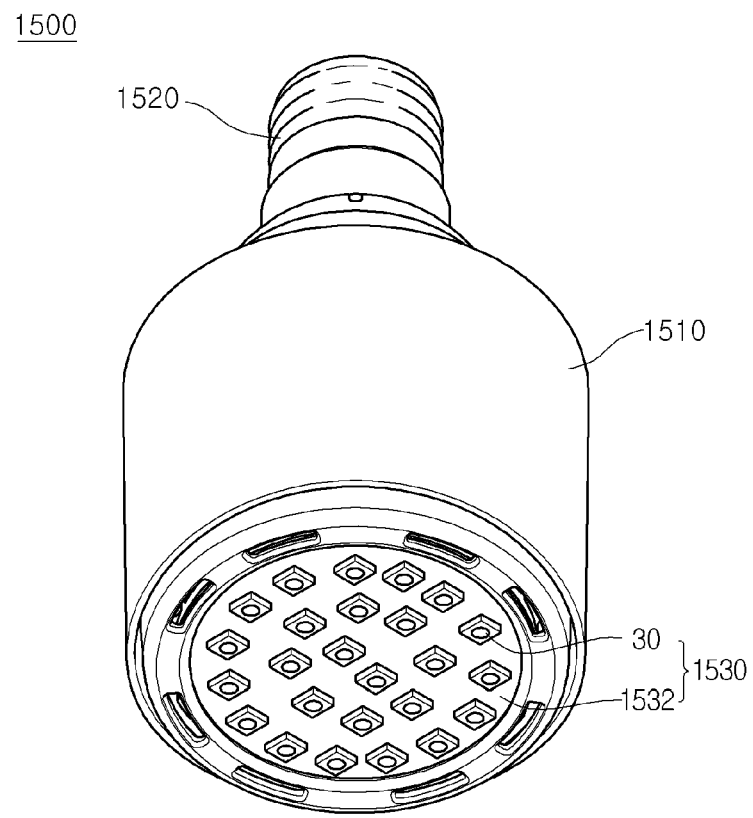
FIG. 31 is a perspective view showing an illumination device according to an embodiment.

The light emitting device or the light emitting device package according to the embodiment can be applied to the light unit. The light unit includes a plurality of light emitting devices or a plurality of light emitting device packages. The light unit may include a display device as shown in FIGS. 29 and 30 and an illumination device as shown in FIG. 31. In addition, the light unit may include an illumination lamp, a signal lamp, a headlight of a vehicle, and an electric sign board.

FIG. 29 is a perspective view showing the display device according to the embodiment.

Referring to FIG. 29, the display device 1000 according to the embodiment includes a light guide plate 1041, a light emitting module 1031 for supplying the light to the light guide plate 1041, a reflective member 1022 provided below the light guide plate 1041, an optical sheet 1051 provided above the light guide plate 1041, a display panel 1061 provided above the optical sheet 1051, and a bottom cover 1011 for receiving the light guide plate 1041, the light emitting module 1031, and the reflective member 1022. However, the embodiment is not limited to the above structure.

The bottom cover 1011, the reflective sheet 1022, the light guide plate 1041 and the optical sheet 1051 may constitute a light unit 1050.

The light guide plate 1041 diffuses the light to provide surface light. The light guide plate 1041 may include transmittive material. For instance, the light guide plate 1041 may include one of acryl-based resin, such as PMMA (polymethyl methacrylate, PET (polyethylene terephthalate), PC (polycarbonate), COC (cyclic olefin copolymer) and PEN (polyethylene naphthalate) resin.

The light emitting module 1031 supplies the light to at least one side of the light guide plate 1041 and serves as the light source of the display device.

At least one light emitting module 1031 is provided to directly or indirectly supply the light from the lateral side of the light guide plate 1041. The light emitting module 1031 may include a substrate 1033 and light emitting device packages 30 according to the embodiments. The light emitting device packages 30 are arranged on the substrate 1033 while being spaced apart from each other at the predetermined interval.

The substrate 1033 may include a printed circuit board (PCB) having a circuit pattern (not shown). In addition, the substrate 1033 may also include a metal core PCB (MCPCB) or a flexible PCB (FPCB), but the embodiment is not limited thereto. If the light emitting device packages 30 are installed on the side of the bottom cover 1011 or on a heat dissipation plate, the substrate 1033 may be omitted. The heat dissipation plate partially makes contact with the top surface of the bottom cover 1011.

In addition, the light emitting device packages 30 are arranged such that light radiation surfaces of the light emitting device packages 30 are spaced apart from the light guide plate 1041 by a predetermined distance, but the embodiment is not limited thereto. The light emitting device packages 30 may directly or indirectly supply the light to a light incident surface, which is one side of the light guide plate 1041, but the embodiment is not limited thereto.

The reflective member 1022 is disposed below the light guide plate 1041. The reflective member 1022 reflects the light, which is traveled downward through the lower surface of the light guide plate 1041, toward the light guide plate 1041, thereby improving the brightness of the light unit 1050. For instance, the reflective member 1022 may include PET, PC or PVC resin, but the embodiment is not limited thereto. The reflective member 1022 may serve as the top surface of the bottom cover 1011, but the embodiment is not limited thereto.

The bottom cover 1011 may receive the light guide plate 1041, the light emitting module 1031, and the reflective member 1022 therein. To this end, the bottom cover 1011 has a receiving section 1012 having a box shape, but the embodiment is not limited thereto. The bottom cover 1011 can be coupled with the top cover, but the embodiment is not limited thereto.

The bottom cover 1011 can be manufactured through a press process or an extrusion process by using metallic material or resin material. In addition, the bottom cover 1011 may include metal or non-metallic material having superior thermal conductivity, but the embodiment is not limited thereto.

The display panel 1061, for instance, is an LCD panel including transmittive first and second substrates, which are opposite to each other, and a liquid crystal layer interposed between the first and second substrates. A polarizing plate can be attached to at least one surface of the display panel 1061, but the embodiment is not limited thereto. The display panel 1061 displays information based on the light that has passed through the optical sheet 1051. The display device 1000 can be applied to various portable terminals, monitors of notebook computers, monitors or laptop computers, and televisions.

The optical sheet 1051 is disposed between the display panel 1061 and the light guide plate 1041 and includes at least one transmittive sheet. For instance, the optical sheet 1051 includes at least one of a diffusion sheet, a horizontal and vertical prism sheet, and a brightness enhancement sheet. The diffusion sheet diffuses the incident light, the horizontal and vertical prism sheet concentrates the incident light onto the display region, and the brightness enhancement sheet improves the brightness by reusing the lost light. In addition, a protective sheet can be provided on the display panel 1061, but the embodiment is not limited thereto.

The light guide plate 1041 and the optical sheet 1051 can be provided in the light path of the light emitting module 1031 as optical members, but the embodiment is not limited thereto.

FIG. 30 is a sectional view showing a display device according to the embodiment.

Referring to FIG. 30, the display device 1100 includes a bottom cover 1152, a substrate 1120 on which the light emitting device packages 30 are arranged, an optical member 1154, and a display panel 1155.

The substrate 1120 and the light emitting device packages 30 may constitute the light emitting module 1060. In addition, the bottom cover 1152, at least one light emitting module 1060, and the optical member 1154 may constitute the light unit.

The bottom cover 1151 can be provided with a receiving section 1153, but the embodiment is not limited thereto.

The optical member 1154 may include at least one of a lens, a light guide plate, a diffusion sheet, a horizontal and vertical prism sheet, and a brightness enhancement sheet. The light guide plate may include PC or PMMA (Poly methyl methacrylate). The light guide plate can be omitted. The diffusion sheet diffuses the incident light, the horizontal and vertical prism sheet concentrates the incident light onto the display region, and the brightness enhancement sheet improves the brightness by reusing the lost light.

The optical member 1154 is disposed above the light emitting module 1060 in order to convert the light emitted from the light emitting module 1060 into the surface light. In addition, the optical member 1154 may diffuse or collect the light.

FIG. 31 is a perspective view showing an illumination device according to the embodiment.

Referring to FIG. 31, the illumination device 1500 includes a case 1510, a light emitting module 1530 installed in the case 1510, and a connection terminal 1520 installed in the case 1510 to receive power from an external power source.

Preferably, the case 1510 includes material having superior heat dissipation property. For instance, the case 1510 includes metallic material or resin material.

The light emitting module 1530 may include a substrate 1532 and light emitting device packages 30 installed on the substrate 1532. The light emitting device packages 30 are spaced apart from each other or arranged in the form of a matrix.

The substrate 1532 includes an insulating member printed with a circuit pattern. For instance, the substrate 1532 includes a PCB, an MCPCB, a flexible PCB, a ceramic PCB, and an FR-4 substrate.

In addition, the substrate 1532 may include material that effectively reflects the light. A coating layer can be formed on the surface of the substrate 1532. At this time, the coating layer has a white color or a silver color to effectively reflect the light.

At least one light emitting device package 30 is installed on the substrate 1532. Each light emitting device package 30 may include at least one LED (light emitting diode) chip. The LED chip may include an LED that emits the light of visible ray band having red, green, blue or white color and a UV (ultraviolet) LED that emits UV light.

The light emitting device packages 30 of the light emitting module 1530 can be variously arranged to provide various colors and brightness. For instance, the white LED, the red LED and the green LED can be arranged to achieve the high color rendering index (CRI).

The connection terminal 1520 is electrically connected to the light emitting module 1530 to supply power to the light emitting module 1530. The connection terminal 1520 has a shape of a socket screw-coupled with the external power source, but the embodiment is not limited thereto. For instance, the connection terminal 1520 can be prepared in the form of a pin inserted into the external power source or connected to the external power source through a wire.

A method of manufacturing a semiconductor light emitting device according to the embodiment includes the steps of forming a first light emitting structure on a first growth substrate, forming a first reflective layer on the first light emitting structure, forming an sacrifice substrate on the first reflective layer, and forming a first chip structure by removing the first growth substrate; forming a second light emitting structure on a second growth substrate and forming a second reflective layer on the second light emitting structure, thereby forming a second chip structure; and forming a first adhesive layer on the first light emitting structure of the first chip structure and forming a second adhesive layer under the second reflective layer of the second chip structure, thereby bonding the first chip structure with the second chip structure.

According to the embodiment, the light emitting device, the light emitting device package or the light emitting module can improve the light efficiency. According to the embodiment, the electrode is disposed under the plural chip structures, so that the light extraction efficiency of the light emitting device can be improved in the vertical and horizontal directions. In addition, since a plurality of LED chips are vertically bonded to each other, the product yield of the chip can be improved.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
   a first chip structure including a first reflective layer and a first light emitting structure having a plurality of compound semiconductor layers on a top surface of the first reflective layer;
   a second chip structure disposed on a top surface of the first chip structure and including a second reflective layer and a second light emitting structure having a plurality of compound semiconductor layers on a top surface of the second reflective layer;
   an electrode on a top surface of the second light emitting structure of the second chip structure;
   a first adhesive layer between the second reflective layer and the first light emitting structure; and
   a second adhesive layer between the first adhesive layer and the second reflective layer,
   wherein the first and second adhesive layers are formed of a conductive material,
   wherein the first adhesive layer is electrically connected to the second adhesive layer,
   wherein the first light emitting structure includes a first conductive semiconductor layer, a first active layer under the first conductive semiconductor layer, and a second conductive semiconductor layer under the first active layer,
   wherein the second light emitting structure includes a third conductive semiconductor layer, a second active layer under the third conductive semiconductor layer, and a fourth conductive semiconductor layer under the second active layer,
   wherein the first reflective layer is electrically connected to the second conductive semiconductor layer, and
   wherein the second reflective layer is electrically connected to the fourth conductive semiconductor layer.

2. The light emitting device as claimed in claim 1, wherein the first chip structure includes a first electrode layer between the first light emitting structure and the first reflective layer.

3. The light emitting device as claimed in claim 2, wherein the first chip structure includes a transmittive insulation layer between the first light emitting structure and the first reflective layer and a conductive layer connecting the first reflective layer with the first light emitting structure,
   wherein the conductive layer is disposed in the transmittive insulation layer and is disposed between the first light emitting structure and the first reflective layer.

4. The light emitting device as claimed in claim 3, wherein the first chip structure includes a second electrode layer between the transmittive insulation layer and the first light emitting structure,
   wherein the transmittive insulation layer is disposed between the first and the second electrode layers, and
   wherein the conductive layer is extended into the first and the second electrode layers.

5. The light emitting device as claimed in claim 4, wherein the conductive layer is formed in a plurality of conductive vias,
   wherein the plurality of conductive vias are disposed in the first electrode layer, the transmittive insulation layer and the second electrode layer,
   wherein the plurality of conductive vias are electrically connected to the first electrode layer and the second electrode layer.

6. The light emitting device as claimed in claim 1, further comprising a conductive support member disposed under a lower surface of the first reflective layer and connected electrically to the first reflective layer.

7. The light emitting device as claimed in claim 2, wherein the second chip structure includes a third electrode layer between the second reflective layer and the second light emitting structure, and the electrode is electrically connected to the first conductive semiconductor layer, wherein the third electrode layer is electrically connected to the second reflective layer and the fourth conductive semiconductor layer.

8. The light emitting device as claimed in claim 1, further comprising a roughness and/or a pattern under the first light emitting structure and/or on the second light emitting structure.

9. The light emitting device as claimed in claim 1, further comprising an insulating layer disposed at an outer peripheral surface of the first and the second light emitting structures.

10. A light emitting device comprising:
a first chip structure emitting a first and including a first reflective layer and a first light emitting structure having a plurality of compound semiconductor layers on a top surface of the first reflective layer; and
a second chip structure electrically bonded onto the first chip structure to emit a second light including a second reflective layer and a second light emitting structure having a plurality of compound semiconductor layers on a top surface of the second reflective layer,
an electrode connected electrically on a top surface of the second light emitting structure;
a support member under a lower surface of the first reflective layer; and
a first adhesive layer between the second reflective layer and the first light emitting structure; and
a second adhesive layer between the first adhesive layer and the second reflective layer,
wherein the first and second adhesive layers are formed of a conductive material,
wherein the first adhesive layer is electrically connected to the second adhesive layer,
wherein the first light emitting structure includes a first conductive semiconductor layer, a first active layer under the first conductive semiconductor layer, and a second conductive semiconductor layer under the first active layer,
wherein the second light emitting structure includes a third conductive semiconductor layer, a second active layer under the third conductive semiconductor layer, and a fourth conductive semiconductor layer under the second active layer,
wherein the first reflective layer is electrically connected to the second conductive semiconductor layer, and
wherein the second reflective layer is electrically connected to the fourth conductive semiconductor layer.

11. The light emitting device as claimed in claim 10, wherein the first chip structure includes a current block layer arranged perpendicularly to the electrode at a lower surface of the second light emitting structure, and at least one channel layer around the second reflective layer and the second light emitting structure.

12. The light emitting device as claimed in claim 10, further comprising a transmittive insulation layer between the first reflective layer and the first light emitting structure and an electrode layer between the first reflective layer and the transmittive insulation layer.

13. The light emitting device as claimed in claim 12, further comprising a plurality of conductive vias contacted with a lower surface of the first light emitting structure,
wherein the plurality of conductive vias are disposed in the transmittive insulation layer.

14. The light emitting device as claimed in claim 10, further comprising a transmittive layer contacted with a lower surface of the second light emitting structure and disposed between the top surface of the second reflective layer and a lower surface of the second light emitting structure.

15. The light emitting device as claimed in claim 10, wherein the first and the second lights have wavelength bands identical to or different from each other.

16. The light emitting device as claimed in claim 13, wherein the electrode is offset from the plurality of conductive vias in a vertical direction.

17. A light emitting device package comprising:
a body;
a plurality of lead electrodes on the body;
a light emitting device bonded onto at least one lead electrode while being electrically connected to the lead electrodes; and
a molding member surrounding the light emitting device,
wherein the light emitting device comprises:
a first chip structure including a first reflective layer and a first light emitting structure having a plurality of compound semiconductor layers on a top surface of the first reflective layer;
a second chip structure bonded onto the first chip structure and including a second reflective layer and a second light emitting structure having a plurality of compound semiconductor layers on a top surface of the second reflective layer;
an electrode on a top surface of the second chip structure;
a support member under a lower surface of the first reflective layer; and
a first adhesive layer between the second reflective layer and the first light emitting structure; and
a second adhesive layer between the first adhesive layer and the second reflective layer,
wherein the first and second adhesive layers are formed of a conductive material,
wherein the first adhesive layer is electrically connected to the second adhesive layer,
wherein the first light emitting structure includes a first conductive semiconductor layer, a first active layer under the first conductive semiconductor layer, and a second conductive semiconductor layer under the first active layer,
wherein the second light emitting structure includes a third conductive semiconductor layer, a second active layer under the third conductive semiconductor layer, and a fourth conductive semiconductor layer under the second active layer,
wherein the first reflective layer is electrically connected to the second conductive semiconductor layer, and
wherein the second reflective layer is electrically connected to the fourth conductive semiconductor layer.

18. The light emitting device package as claimed in claim 17, wherein the first and second chip structures emit lights having wavelength bands identical to or different from each other.

19. The light emitting device package as claimed in claim 1, wherein the first adhesive layer is electrically connected to the first conductive semiconductor layer and the second adhesive layer is electrically connected to the second reflective layer.

20. The light emitting device package as claimed in claim 1, wherein the first and the third conductive semiconductor layers include an n-type dopant and the second and the fourth conductive semiconductor layers include a p-type dopant,
wherein the first light emitting structure is electrically connected to the second light emitting structure.

* * * * *